(12) United States Patent
Lee et al.

(10) Patent No.: US 12,200,993 B2
(45) Date of Patent: Jan. 14, 2025

(54) DISPLAY DEVICE

(71) Applicant: SAMSUNG DISPLAY CO., LTD., Yongin-si (KR)

(72) Inventors: Ansu Lee, Yongin-si (KR); Jihye Lee, Yongin-si (KR); Kangmoon Jo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 102 days.

(21) Appl. No.: 17/119,948

(22) Filed: Dec. 11, 2020

(65) Prior Publication Data
US 2021/0328002 A1 Oct. 21, 2021

(30) Foreign Application Priority Data
Apr. 21, 2020 (KR) .................. 10-2020-0048310

(51) Int. Cl.
*H10K 59/131* (2023.01)
*H10K 59/123* (2023.01)
*G09G 3/3258* (2016.01)
*G09G 3/3266* (2016.01)
*G09G 3/3275* (2016.01)

(52) U.S. Cl.
CPC ....... *H10K 59/1315* (2023.02); *H10K 59/123* (2023.02); *G09G 3/3258* (2013.01); *G09G 3/3266* (2013.01); *G09G 3/3275* (2013.01)

(58) Field of Classification Search
CPC ............. H01L 27/3276; H01L 27/3279; H01L 51/5228
See application file for complete search history.

(56) References Cited

U.S. PATENT DOCUMENTS

| | | | |
|---|---|---|---|
| 2003/0128173 A1* | 7/2003 | Ko | H01L 27/3265 345/82 |
| 2010/0060147 A1* | 3/2010 | Eom | H01L 51/5212 313/504 |
| 2014/0132584 A1* | 5/2014 | Kim | H01L 21/76805 345/82 |
| 2016/0064411 A1* | 3/2016 | Park | G09G 3/3233 257/89 |
| 2016/0111487 A1* | 4/2016 | Jeong | H10K 59/1315 257/40 |

(Continued)

FOREIGN PATENT DOCUMENTS

| JP | 2016-188902 | 11/2016 |
|---|---|---|
| KR | 10-1491136 | 2/2015 |

(Continued)

*Primary Examiner* — Bryan R Junge
(74) *Attorney, Agent, or Firm* — F. CHAU & ASSOCIATES, LLC

(57) ABSTRACT

A display device includes a display element that includes a pixel electrode and a common electrode, a driving thin-film transistor, a first thin-film transistor connected to a gate electrode of the driving thin-film transistor and a first initialization voltage, a second thin-film transistor connected to the pixel electrode of the display element and a second initialization voltage line, and a common voltage line connected to the first initialization voltage line and the second initialization voltage line, wherein a voltage equal to a voltage transmitted to the common electrode is transmitted to the common voltage line.

9 Claims, 13 Drawing Sheets

(56) References Cited

U.S. PATENT DOCUMENTS

| | | | | |
|---|---|---|---|---|
| 2016/0126287 A1* | 5/2016 | Her | ................... | H01L 51/5225 |
| | | | | 257/88 |
| 2017/0140706 A1* | 5/2017 | Song | ................... | G09G 3/3233 |
| 2018/0308427 A1* | 10/2018 | Zhang | ................. | G09G 3/3233 |
| 2019/0207168 A1* | 7/2019 | Lee | ................... | H01L 51/5206 |
| 2020/0118508 A1* | 4/2020 | Park | ................... | H01L 27/1251 |
| 2021/0193688 A1* | 6/2021 | Shin | ................... | H01L 27/124 |

FOREIGN PATENT DOCUMENTS

| KR | 10-1920492 | 11/2018 |
|---|---|---|
| KR | 10-2019-0069730 | 6/2019 |
| KR | 10-2016614 | 9/2019 |

\* cited by examiner

DISPLAY DEVICE

CROSS-REFERENCE TO RELATED APPLICATION

This application claims priority under 35 USC § 119 from, and the benefit of, Korean Patent Application No. 10-2020-0048310, filed on Apr. 21, 2020 in the Korean Intellectual Property Office, the contents of which are herein incorporated by reference in their entirety.

BACKGROUND

1. Technical Field

One or more embodiments are directed to display devices.

2. Discussion of Related Art

A display device includes a plurality of pixels, each including a display element and a pixel circuit that controls electrical signals applied to the display element. The pixel circuit includes a thin-film transistor (TFT), a capacitor, and a plurality of wires. As the pixel circuit becomes more complex, research has been actively conducted to provide a display device with improved display quality.

SUMMARY

One or more embodiments provide display devices in which a voltage drop of a common electrode is prevented.

Additional aspects will be set forth in part in the description which follows and, in part, will be apparent from the description, or may be learned by practice of embodiments of the disclosure.

A display device according to an embodiment includes a display device that includes a display element that includes a pixel electrode and a common electrode, a driving thin-film transistor, a first thin-film transistor connected to a gate electrode of the driving thin-film transistor and a first initialization voltage, a second thin-film transistor connected to a pixel electrode of the display element and a second initialization voltage line, and a common voltage line connected to the first initialization voltage line and the second initialization voltage line, wherein a same voltage is transmitted to the common electrode and the common voltage line.

The first initialization voltage line and the second initialization voltage may each extend in a first direction and may be spaced apart from each other, and the common voltage line may extend in a second direction different from the first direction and cross the first initialization voltage line and the second initialization voltage line.

The first initialization voltage line and the second initialization voltage line may each include a semiconductor material.

The display device may include a connecting electrode may be disposed on a layer between the common voltage line and the pixel electrode and be connected to the common voltage line and the common electrode.

The connecting electrode may include a first connecting electrode that overlaps a region in which the first initialization voltage line and the common voltage line are connected to each other, and a second connecting electrode that overlaps a region in which the second initialization voltage line and the common voltage line are connected to each other.

The display device may further include a data line disposed on a layer between the common voltage line and the connecting electrode.

The display device may further include a driving voltage line connected to the driving thin-film transistor. The driving voltage line may include a first driving voltage line that extends in a first direction, and a second driving voltage line that extends in a second direction different from the first direction and connected to the first driving voltage line.

The driving voltage line may be positioned on the same layer as the common voltage line.

The display device may further include a data line positioned on a layer between the driving voltage line and the pixel electrode.

The display device may further include a capacitor connected to the gate electrode of the driving thin-film transistor and the driving voltage line.

A display device according to an embodiment may include a plurality of pixels, where each of the plurality of pixels includes at least two sub-pixels, and each of the at least two sub-pixels includes a pixel electrode, a first initialization voltage line and a second initialization voltage line, where each of the first initialization voltage line and the second initialization voltage line extends in a first direction and are connected to pixels that are adjacent in the first direction, a plurality of first common voltage lines positioned between pixels that are adjacent in the first direction extend in a second direction different from the first direction, and are connected to the first initialization voltage line and the second initialization voltage line, and a common electrode that faces the pixel electrodes of the plurality of pixels, wherein a same voltage is transmitted to the common electrode and the plurality of first common voltage lines.

Each of first initialization voltage line and the second initialization voltage line may include a semiconductor material.

The display device may further include a plurality of connecting electrodes disposed on a layer between the first common voltage lines and the pixel electrodes and that contact the first common voltage lines and the common electrode.

The connecting electrode may include a first connecting electrode disposed in a region in which the first initialization voltage line and the first common voltage line overlap each other, and a second connecting electrode disposed in a region in which the second initialization voltage line and the first common voltage line overlap each other.

The display device may further include a plurality of second common voltage lines positioned between adjacent pixels in the first direction and that extend in the second direction, and a plurality of connecting electrodes disposed on a layer between the second common voltage lines and the pixel electrodes, where each of the plurality of connecting electrodes may contact contacting the second common voltage lines and the common electrode, wherein the plurality of first common voltage lines and the plurality of second common voltage lines may be alternately positioned along the first direction, and wherein each of the plurality of second common voltage lines may be connected to the first initialization voltage line and the second initialization voltage line.

The display device may further include a plurality of second common voltage lines, where each of the plurality of second common voltage lines may extend in the second direction and be positioned between adjacent pixels that are adjacent in the first direction, and a plurality of connecting electrodes disposed on a layer between the second common voltage lines and the pixel electrodes, where each of the plurality of connecting electrodes may contact one of the plurality of second common voltage lines and the common electrode, wherein a pair of a first common voltage line and a second common voltage line may be positioned adjacent to each other between adjacent pixels, and where each of the plurality of second common voltage lines may be connected to the first initialization voltage line and the second initialization voltage lin.

The display device may further include a plurality of data lines connected to each of the sub-pixels and that extend in the second direction.

A display device according to an embodiment may include a plurality of pixels, a first initialization voltage line, a second initialization voltage line, where each of the first initialization voltage line and the second initialization voltage line extends in a first direction and is connected to adjacent pixels, a plurality of first common voltage lines positioned between adjacent pixels, that extend in a second direction different from the first direction, and that are connected to the first initialization voltage line and the second initialization voltage line, a common electrode that faces the plurality of pixels; and a plurality of connecting electrodes that connect the plurality of first common voltage lines and the common electrode, where a same voltage is transmitted to the common electrode and the plurality of first common voltage lines.

The plurality of connecting electrodes may be disposed on a layer between the first common voltage lines and the pixel electrodes.

The display device may further include a driving thin-film transistor that is connected to first initialization voltage line, and a driving voltage line connected to the driving thin-film transistor. The driving voltage line may include a first driving voltage line that extends in a first direction, and a second driving voltage line that extends in a second direction different from the first direction and is connected to the first driving voltage line.

DETAILED DESCRIPTION

Figure 1:
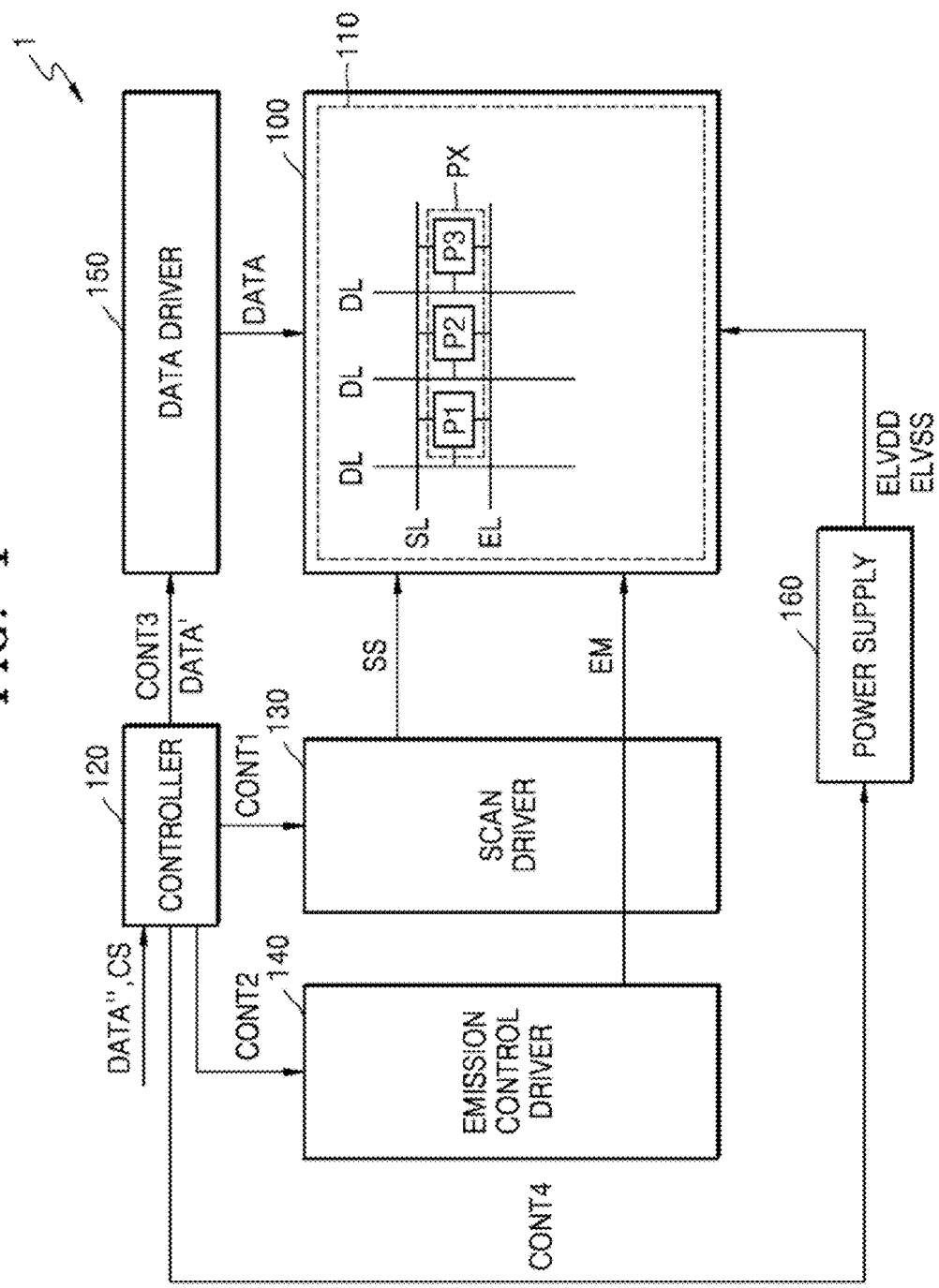
FIG. 1 is a block diagram of a display device according to an embodiment.

Reference will now be made in detail to embodiments, examples of which are illustrated in the accompanying drawings, wherein like reference numerals may refer to like elements throughout.

In the following embodiments, when a part of a film, region, element, or the like is described to be on another part, this includes not only a case where it is directly above the other part, but also a case where other films, regions, element s, or the like are interposed therebetween.

In the drawings, the size of elements may be exaggerated or reduced for convenience of description.

In the following embodiments, when X and Y are connected, it may include cases where X and Y are electrically connected, X and Y are functionally connected, and X and Y are directly connected.

FIG. 1 is a block diagram of a display device according to an embodiment.

Referring to FIG. 1, a display device 1 according to an embodiment includes a pixel unit 110, a controller 120, a scan driver 130, an emission control driver 140, a data driver 150, and a power supply 160.

Hereinafter, an organic light-emitting display device will be described as an example of the display device 1 according to an embodiment, but embodiments of the disclosure are not limited thereto. In another embodiment, the display device 1 of the disclosure may be an inorganic light-emitting (EL) display device or a quantum dot light-emitting display.

According to an embodiment, the display device 1 includes a substrate 100, and the pixel unit 110 disposed thereon in which a plurality of unit pixels PX, hereinafter referred to as "pixel PX", are disposed, each unit pixel PX including at least two sub-pixels, for example, first to third sub-pixels P1, P2, and P3, which are repeatedly arranged in a first direction, which is an x direction or row direction, and a second direction, which is a y direction or column direction. A first sub-pixel P1 emits light of a first color, a second sub-pixel P2 emits light of a second color, and a third sub-pixel P3 emits light of a third color. In an embodiment, the first sub-pixel P1 is a red sub-pixel that emits red light, the second sub-pixel P2 is a green sub-pixel that emits green light, and the third sub-pixel P3 is a blue sub-pixel that emits blue light.

According to an embodiment, a plurality of scan lines SL, a plurality of data lines DL, and a plurality of emission control lines EL, which are connected to the pixels PX, are disposed in the pixel unit 110. The scan lines SL are regularly spaced apart from each other and arranged in rows, and a scan signal SS is transmitted through each of the scan lines SL. The data lines DL are regularly spaced apart from each other and arranged in columns, and each of data lines DL transmits a data signal DATA. The emission lines EL are regularly spaced apart from each other and arranged in rows, and each of the plurality of light emission control lines EL transmits an emission control signal EM. In addition, the pixel unit 110 further includes a plurality of driving voltage lines that transmit a driving voltage ELVDD, and a plurality of common voltage lines to transmit a common voltage ELVSS.

According to an embodiment, the controller 120 receives an input image signal DATA" and an input control signal CS from an external system. The controller 120 can be implemented with a plurality of frame memories and any control device that includes a function that can control the frame memories. For example, the controller 120 can be implemented as a central processing unit (CPU) or a microprocessor unit (MPU) of a mobile terminal equipped with the display device 1. The input control signal CS includes a main clock signal and a timing signal.

According to an embodiment, the controller 120 generates control signals that control driving timings of the scan driver 130, the emission control driver 140, the data driver 150, and the power supply 160. The controller 120 generates first to fourth control signals CONT1 to CONT4 based on the input control signal CS, and outputs the generated control signals to the scan driver 130, the emission control driver 140, the data driver 150, and the power supply 160, respectively. Each of the first to fourth control signals CONT1 to CONT4 includes one or more control signals. For example, a first control signal CONT1 includes a vertical sync signal Vsync, a horizontal sync signal Hsync, a scan start signal (SSP) that signals a scan start, a shift clock signal (SSC) that controls a scan pulse width, etc. A third control signal CONT3 includes a vertical sync signal Vsync, a horizontal sync signal Hsync, a data start signal (DSP) that signals the start of data, an output enable signal (DE) that controls a data signal to be output to a data line, a sampling clock signal (DSC), etc.

According to an embodiment, the controller 120 stores the input image signal DATA" in units of frames, and transmits a stored image signal DATA' to the data driver 150. The image signal DATA' output by the controller 120 may be the same as the input image signal DATA" or may be a corrected and converted image signal of the input image signal DATA".

Figure 2:
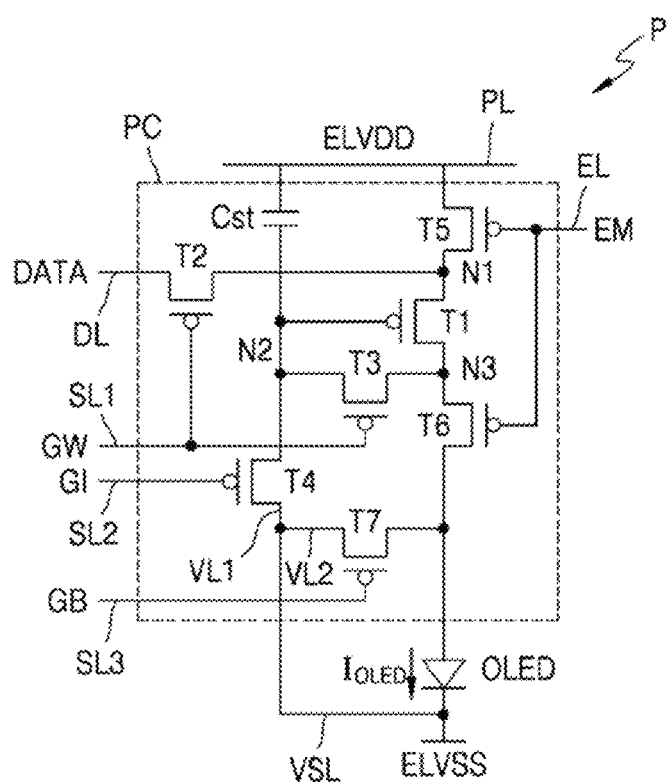
FIG. 2 is an equivalent circuit diagram of a sub-pixel according to an embodiment.

According to an embodiment, the scan driver 130 is connected to plurality of the scan lines SL of the pixel unit 110, and generates a scan signals SS with an ON voltage based on the first control signal CONT1 and sequentially transmits the scan signals SS to the scan lines SL. The scan driver 130 may include a shift register. The ON voltage may be a high level or low level voltage. In an embodiment, one or more scan lines SL are connected to each of the first to third sub-pixels P1, P2, and P3, and correspondingly, the scan driver 130 generates one or more scan signals SS. For example, as illustrated in FIG. 2, scan lines connected to a sub-pixel P include first to third scan lines SL1 to SL3, and the scan driver 130 generates first to third scan signals GW, GI, and GB and outputs the generated first to third scan signals GW, GI, and GB to first to third scan lines SL1 to SL3, respectively.

According to an embodiment, the emission control driver 140 is connected to a plurality of light emission control lines EL of the pixel unit 110, and generates light emission control signals EM with an ON voltage based on a second control signal CONT2 and sequentially transmits the emission control signals EM to the light emission control lines EL.

According to an embodiment, the data driver 150 is connected to a plurality of data lines DL of the pixel unit 110, and transmits a data signal DATA to the data lines DL based on the third control signal CONT3. The data driver 150 converts the image signal DATA' received from the controller 120 into a data signal DATA in the form of a voltage or current.

According to an embodiment, the power supply 160 generates a driving voltage ELVDD and a common voltage ELVSS according to a fourth control signal CONT4. The power supply 160 transmits the driving voltage ELVDD and common voltage ELVSS to the pixel unit 110 through driving voltage lines and common voltage lines. The driving voltage ELVDD has a higher voltage level than the common voltage ELVSS.

According to embodiments, each of the controller 120, the scan driver 130, the emission control driver 140, the data driver 150, and the power supply 160 may be formed as a separate integrated circuit chip or a single integrated circuit chip, and may be directly mounted on the substrate 100 on which the pixel unit 110 is formed, mounted on a flexible printed circuit film, attached to the substrate 100 in the form of a tape carrier package (TCP), or directly formed on the substrate 100.

In an embodiment of FIG. 1, the emission control driver 140 is separate from the scan driver 130 and generates a light emission control signal EM and transmits the emission control signal EM to the pixel unit 110, but in another embodiment, the scan driver 130 generates the scan signal SS and the emission control signal EM and transmits the scan signal SS and emission control signal EM to the pixel unit 110.

FIG. 2 is an equivalent circuit diagram of a sub-pixel according to an embodiment.

According to an embodiment, a sub-pixel P shown in FIG. 2 is one of first to third sub-pixels P1, P2, and P3, and the first to third sub-pixels P1, P2, and P3 each include the same pixel circuit. Hereinafter, for convenience of description, the first to third sub-pixels P1 to P3 will be referred to as sub-pixels P.

Referring to FIG. 2, according to an embodiment, a sub-pixel P includes as display elements an organic light-emitting diode (OLED), and a pixel circuit PC connected to the organic light-emitting diode (OLED). The pixel circuit PC includes first to seventh transistors T1 to T7, and depending on whether the transistor type is a p-type or an n-type or the operating conditions, each of the first to seventh transistors T1 to T7 includes a first terminal which is a source terminal or a drain terminal, and a second terminal which differs from the first terminal. For example, when the first terminal is a source terminal, the second terminal is a drain terminal. In an embodiment, the first to seventh transistors T1 to T7 are implemented as p-channel MOSFETs (PMOS).

According to an embodiment, the pixel circuit PC is connected to a first scan line SL1 that transmits a first scan signal GW, a second scan line SL2 that transmits a second scan signal GI, a third scan line SL3 that transmits a third scan signal GB, a light emission control line EL that transmits a light emission control signal EM, and a data line DL that transmits a data signal DATA.

According to an embodiment, the pixel circuit PC is also connected to a driving voltage line PL, a first initialization voltage line VL1, a second initialization voltage line VL2, and a common voltage line VSL. The driving voltage line PL transmits a driving voltage ELVDD to a first transistor T1. The first initialization voltage line VL1 is connected to the common voltage line VSL, and transmits a common voltage ELVSS to a gate terminal of the first transistor T1. The second initialization voltage line VL2 is connected to the common voltage line VSL, and transmits a common voltage ELVSS to an organic light-emitting diode (OLED).

According to an embodiment, the first transistor T1 includes a gate terminal connected to a second node N2, a first terminal connected to a first node N1, and a second terminal connected to a third node N3. The first transistor T1 is a driving transistor, and receives a data signal DATA based on a switching operation of the second transistor T2 to supply a driving current to the organic light-emitting diode (OLED).

According to an embodiment, the second transistor T2 is a switching transistor and includes a gate terminal connected to the first scan line SL1, a first terminal connected to the data line DL, and a second terminal connected to the first node N1, or the first terminal of the first transistor T1. The second transistor T2 is turned on according to a first scan signal GW received through the first scan line SL1 to perform a switching operation that transmits a data signal DATA received from the data line DL to the first node N1.

According to an embodiment, the third transistor T3 is a compensation transistor and includes a gate terminal connected to the first scan line SL1, a first terminal connected to the second node N2 or the gate terminal of the first transistor T1, and a second terminal connected to the third node N3 or the second terminal of the first transistor T1. The third transistor T3 is turned on based on a first scan signal GW received through the first scan line SL1 to diode-connect the first transistor T1 to compensate a threshold voltage of the first transistor T1. The third transistor T3 may include a structure in which two or more transistors are connected in series.

According to an embodiment, the fourth transistor T4 is a first initialization transistor and includes a gate terminal connected to the second scan line SL2, a first terminal connected to the first initialization voltage line VL1, and a second terminal connected to the second node N2. The first initialization voltage line VL1 is connected to the common voltage line VSL. The fourth transistor T4 is turned on based on a second scan signal GI received through the second scan line SL2, and transmits a common voltage ELVSS to the gate terminal of the first transistor T1 to initialize a gate voltage of the first transistor T1. The fourth transistor T4 may include a structure in which two or more transistors are connected in series.

According to an embodiment, the fifth transistor T5 is a first light emission control transistor and includes a gate terminal connected to the light emission control line EL, a first terminal connected to the driving voltage line PL, and a second terminal connected to the first node N1. The sixth transistor T6 is a second light emission control transistor and includes a gate terminal connected to the light emission control line EL, a first terminal connected to the third node N3, and a second terminal connected to a pixel electrode of the organic light-emitting diode (OLED). The fifth transistor T5 and the sixth transistor T6 are simultaneously turned on based on a light emission control signal EM received through the light emission control line EL, and current flows to the organic light-emitting diode (OLED).

According to an embodiment, the seventh transistor T7 is a second initialization transistor and includes a gate terminal connected to the third scan line SL3, a first terminal connected to the second terminal of the sixth transistor T6 and a pixel electrode of the organic light-emitting diode (OLED), and a second terminal connected to the second initialization voltage line VL2. The second initialization voltage line VL2 is connected to the common voltage line VSL. The seventh transistor T7 is turned on based on a third scan signal GB received through the third scan line SL3 and transmits a common voltage ELVSS to the pixel electrode of the organic light-emitting diode (OLED) and initializes a voltage of the pixel electrode of the organic light-emitting diode (OLED). The seventh transistor T7 may be omitted.

According to an embodiment, a capacitor Cst includes a first electrode connected to the second node N2, and a second electrode connected to the driving voltage line PL.

According to an embodiment, the organic light-emitting diode (OLED) includes a pixel electrode and a common electrode that faces the pixel electrode, and the common electrode receives a common voltage ELVSS. The common electrode is connected to the common voltage line VSL. The organic light-emitting diode (OLED) receives a driving current $I_{OLED}$ from the first transistor T1 and emits light of a preset color to display an image. The common electrode is common to the plurality of sub-pixels P, that is, is integrally formed.

Figure 3:
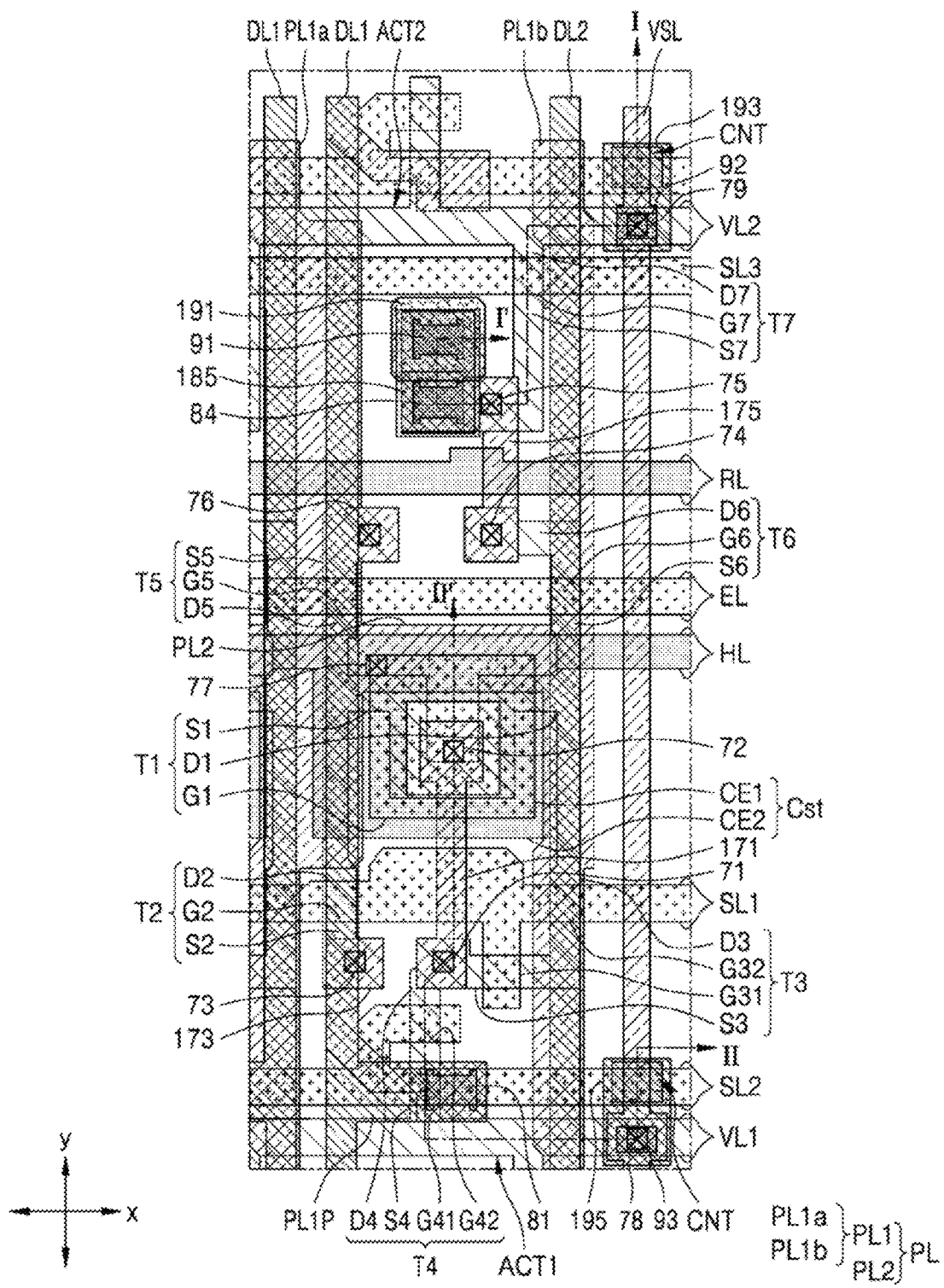
FIG. 3 is a plan view of a pixel circuit of a sub-pixel according to an embodiment.
Figure 4:
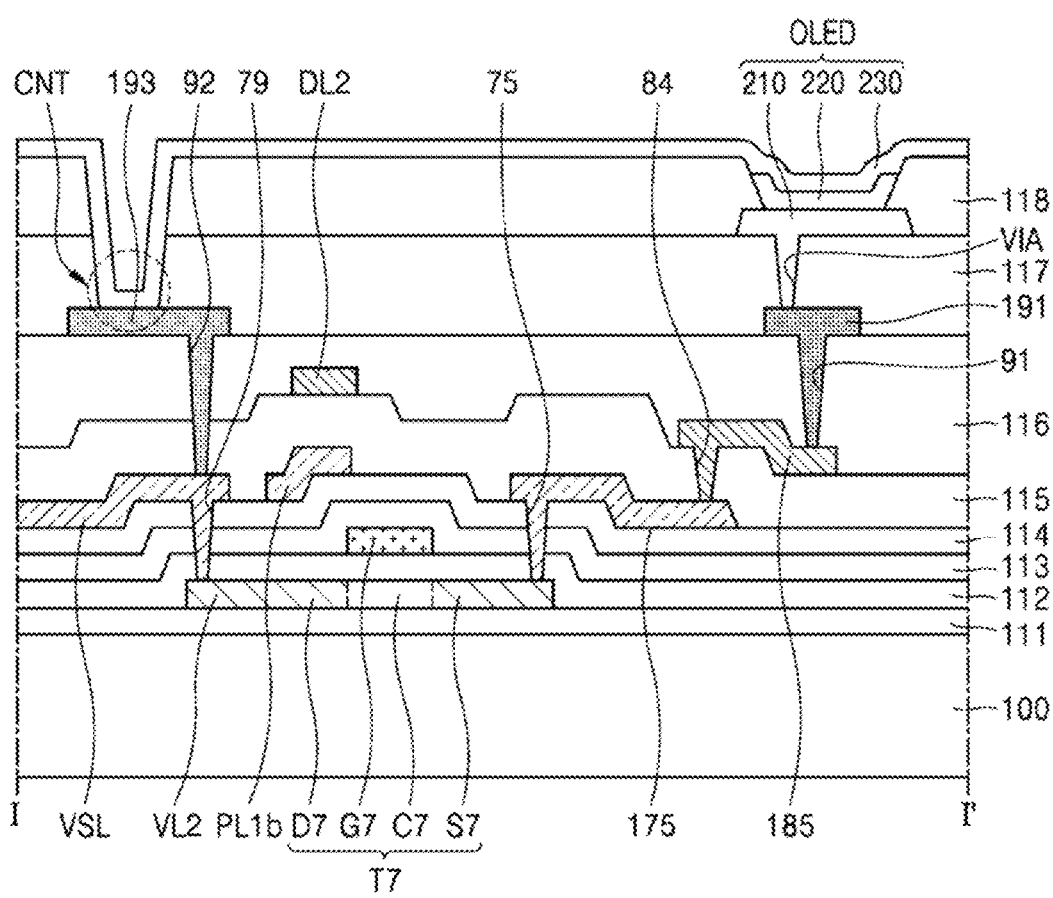
FIG. 4 is a cross-sectional view of a pixel circuit taken along line I-I' of FIG. 3.
Figure 5:
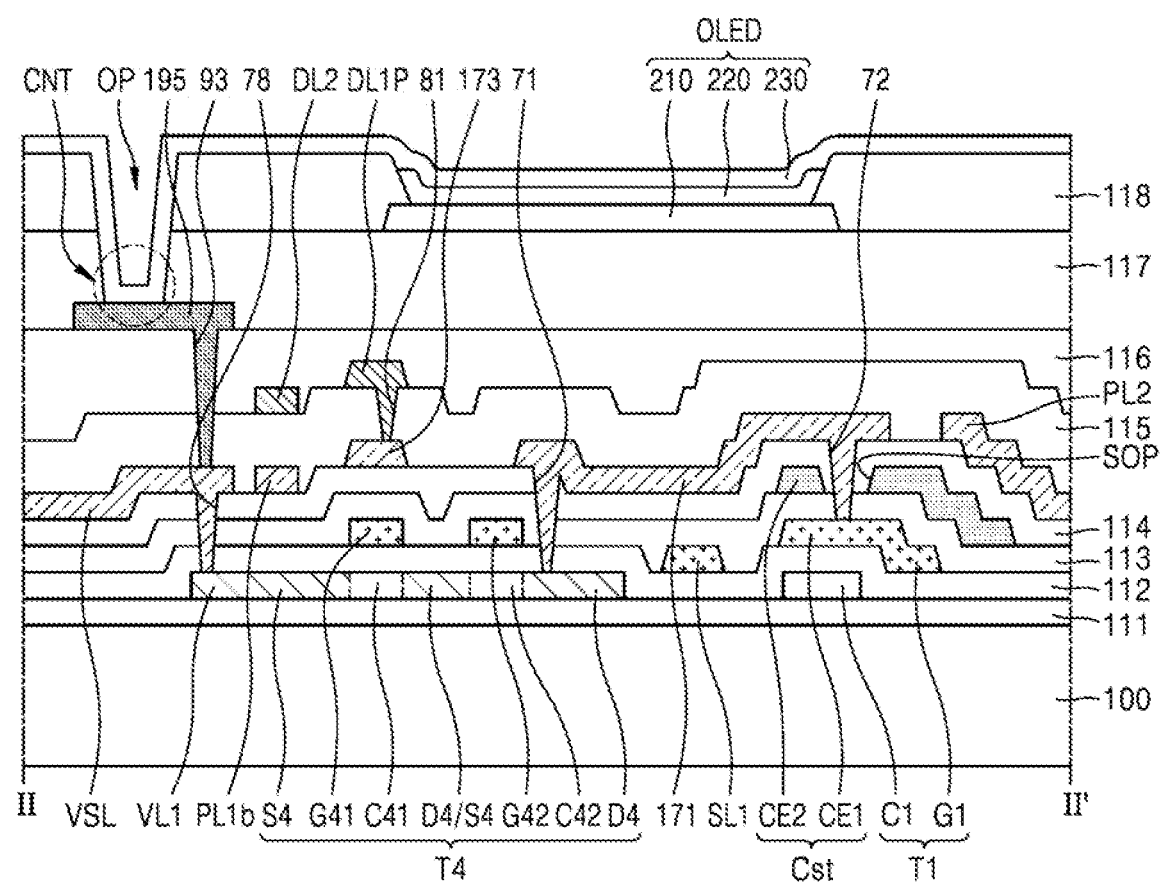
FIG. 5 is a cross-sectional view of a pixel circuit taken along line II-II' of FIG. 3.

FIG. 3 is a plan view of a pixel circuit of a sub-pixel according to an embodiment. FIG. 4 is a cross-sectional view of the pixel circuit cut along line I-I' of FIG. 3. FIG. 5 is a cross-sectional view of the pixel circuit cut along line II-II' of FIG. 3. FIG. 3 is a plan view of the pixel circuit of FIG. 2. Each of the first to seventh transistors T1 to T7 of FIG. 2 is implemented as a thin-film transistor. Hereinafter, the first to seventh thin-film transistors T1 to T7 will be described.

In an embodiment, two first and second data lines DL1 and DL2 extend in parallel in a columnar direction, and the pixel circuit is connected to one of the two first and second data lines DL1 and DL2. The embodiment of FIG. 3 shows an example in which the pixel circuit is connected to the first data line DL1 of the first and second data lines DL1 and DL2. However, embodiments are not limited thereto, and in another embodiment, the pixel circuit of FIG. 3 is connected to the second data line DL2.

In an embodiment, the gate terminal, first terminal, and second terminal of a transistor of the pixel circuit of FIG. 2 correspond to the gate electrode, source region, and drain region of a thin-film transistor of FIG. 3, respectively. The source region and the drain region may be a source electrode and drain electrode of the thin-film transistor, as the case may be.

In an embodiment, a first semiconductor layer ACT1 and a second semiconductor layer ACT2 are formed on the substrate 100. A buffer layer 111 is formed on the substrate 100, and the first semiconductor layer ACT1 and the second semiconductor layer ACT2 are formed on the buffer layer 111. The first semiconductor layer ACT1 and the second semiconductor layer ACT2 are separated from each other and are connected by a connecting electrode 175.

In an embodiment, the substrate 100 may include glass, a ceramic, a metal, or a flexible or bendable material. When the substrate 100 is flexible or bendable, the substrate 100 includes a polymer resin such as polyethersulphone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

In an embodiment, the substrate 100 may have a multi-layer structure. For example, the substrate 100 is a structure in which a first base layer, a first barrier layer, a second base layer, and a second barrier layer are sequentially stacked. The first base layer and the second base layer include the aforementioned polymer resins. The first barrier layer and the second barrier layer prevent the penetration of foreign substances, and may be a single layer or a multi-layer that includes inorganic materials, such as silicon nitride ($SiN_x$) or silicon oxide ($SiO_x$).

In an embodiment, the buffer layer 111 increases the smoothness of a top surface of the substrate 100, and the buffer layer 111 may include an oxide film such as silicon oxide (SiO$_x$), or a nitride film such as silicon nitride (SiN$_x$), or silicon oxynitride (SiON).

In an embodiment, the first semiconductor layer ACT1 and the second semiconductor layer ACT2 include a silicon semiconductor. For example, the first semiconductor layer ACT1 and the second semiconductor layer ACT2 include low temperature poly-silicon (LTPS).

In an embodiment, some regions of the first semiconductor layer ACT1 include a semiconductor layer of each of the first to sixth thin-film transistors T1 to T6. In addition, the first semiconductor layer ACT1 includes the first initialization voltage line VL1 that extends in the first direction. Some regions of the second semiconductor layer ACT2 include a semiconductor layer of the seventh thin-film transistor T7. In addition, the second semiconductor layer ACT2 includes the second initialization voltage line VL2 that extends in the first direction. That is, the first initialization voltage line VL1 and the second initialization voltage line VL2 each include a silicon semiconductor.

In an embodiment, the semiconductor layers of the first to seventh thin-film transistors T1 to T7 include source regions S1 to S7, drain regions D1 to D7, and channel regions between the source regions S1 to S7 and the drain regions D1 to D7. In FIGS. 4 and 5, a channel region C1 of the first thin-film transistor T1, channel regions C41 and C42 of the fourth thin-film transistor T4, and a channel region C7 of the seventh thin-film transistor T7 are shown as examples. The lengths of the channel region C1 of the first thin-film transistors T1 of different sub-pixels may be the same or different. For example, the length of the channel region C1 of the first thin-film transistor T1 of a first sub-pixel is the same as the length of the channel region C1 of the first thin-film transistor T1 of a second sub-pixel, and differs from the length of the channel region C1 of the first thin-film transistor of a third sub-pixel. In this case, the length of the channel region C1 of the first thin-film transistor T1 of the third sub-pixel is shorter than the length of the channel region C1 of the first thin-film transistor T1 of the first sub-pixel.

In an embodiment, a channel region overlaps a gate electrode. A source region and a drain region are doped with impurities and located near the channel region. Depending on an embodiment, positions of the source region and the drain region can change.

In an embodiment, a first gate insulating layer 112 is positioned on the first semiconductor layer ACT1 and the second semiconductor layer ACT2, and the gate electrode G1 of the first thin-film transistor T1, the first scan line SL1, the second scan line SL2, the third scan line SL3, and the light emission control line EL are positioned on the first gate insulating layer 112. The first scan line SL1, the second scan line SL2. the third scan line SL3, and the light emission control line EL extend in a first direction, and are spaced apart from each other in the second direction.

In an embodiment, the first gate insulating layer 112 includes one or more of silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO$_2$), etc.

In an embodiment, the gate electrode G1 of the first thin-film transistor T1 overlaps the first semiconductor layer ACT1, and is provided as an isolated pattern.

In an embodiment, a region of the first scan line SL1 that overlaps a channel region of the second thin-film transistor T2 is the gate electrode G2 of the second thin-film transistor T2, and regions of the first scan line SL1 that overlap channel regions of the third thin-film transistor T3 are gate electrodes G31 and G32 of the third thin-film transistor T3. Regions of the second scan line SL2 that overlap channel regions of the fourth thin-film transistor T4 are gate electrodes G41 and G42 of the fourth thin-film transistor T4. A region of the third scan line SL3 that overlaps a channel region of the seventh thin-film transistor T7 is a gate electrode G7 of the seventh thin-film transistor T7. Regions of the light emission control line EL that overlap channel regions of the fifth and sixth thin-film transistors T5 and T6 are gate electrodes G5 and G6 of the fifth and sixth thin-film transistors T5 and T6, respectively.

In an embodiment, the gate electrode G1 of the first thin-film transistor T1, the first scan line SL1, the second scan line SL2, the third scan line SL3, and the light emission control line EL include at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu), and may be formed of a single layer or of multiple layers of one or more materials.

In an embodiment, a second gate insulating layer 113 is positioned on the gate electrode G1 of the first thin-film transistor T1, the first scan line SL1, the second scan line SL2, the third scan line SL3, the light emission control line EL and the first gate insulating layer 112. The second gate insulating layer 113 includes one or more of silicon oxide (SiO$_2$), silicon nitride (SiN$_x$), silicon oxynitride (SION), aluminum oxide (Al$_2$O$_3$), titanium oxide (TiO$_2$), tantalum oxide (Ta$_2$O$_5$), hafnium oxide (HfO$_2$), or Zinc oxide (ZnO$_2$), etc.

In an embodiment, an electrode voltage line HL and a repair line RL are positioned on the second gate insulating layer 113. The electrode voltage line HL and the repair line RL extend in the first direction, and are spaced apart from each other in the second direction.

In an embodiment, the repair line RL can repair a pixel in the event of a defect in the pixel circuit. For example, in a repair process, the repair line RL is electrically connected to the connecting electrode 175 and to the organic light-emitting diode (OLED) through the connecting electrode 175. Accordingly, a driving current received from outside of the pixel unit 110 can be transmitted to the organic light-emitting diode (OLED) so that the organic light-emitting diode (OLED) thereby emits light. The repair line RL may be omitted.

In an embodiment, the electrode voltage line HL covers at least a portion of the gate electrode G1 of the first thin-film transistor T1 and function as an upper electrode CE2 of the capacitor Cst. The electrode voltage line HL includes an opening SOP.

In an embodiment, a lower electrode CE1 of the capacitor Cst is formed integrally with the gate electrode G1 of the first thin-film transistor T1. For example, the gate electrode G1 of the first thin-film transistor T1 can function as the lower electrode CE1 of the capacitor Cst.

In an embodiment, the electrode voltage line HL and the repair line RL may be formed as a single layer or as multiple layers of one or more materials selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu), etc.

In an embodiment, a first interlayer insulating layer 114 is positioned on the electrode voltage line HL and repair line RL, and the second gate insulating layer 113. The first interlayer insulating layer 114 includes one or more of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), etc.

In an embodiment, the driving voltage line PL, the common voltage line VSL, a node electrode 171 and connecting electrodes 173 and 175 are positioned on the first interlayer insulating layer 114.

In an embodiment, the driving voltage line PL, the common voltage line VSL, the node electrode 171, and connecting electrodes 173 and 175 each include a conductive material that includes one or more of molybdenum (Mo), aluminum (Al), copper (Cu), or titanium (Ti), etc., and may be formed of multiple layers or as a single layer. For example, the driving voltage line PL, the common voltage line VSL, the node electrode 171, and the connecting electrodes 173 and 175 may be formed of multiple layers of Ti/Al/Ti.

In an embodiment, the driving voltage line PL includes a first driving voltage line PL1 and a second driving voltage line PL2.

In an embodiment, the first driving voltage line PL1 extends in a second direction and includes a first sub driving voltage line PL1a and second sub driving voltage line PL1b that face each other. The first sub driving voltage line PL1a and the second sub driving voltage line PL1b are positioned with a first thin-film transistor T1 therebetween, in a plan view. The first sub driving voltage line PL1a overlaps the first data line DL1 or the second data line DL2, and the second sub driving voltage line PL1b overlaps the second data line DL2 or the first data line DL1. FIG. 3 shows an example of a pixel circuit in which the first sub driving voltage line PL1a overlaps the first data line DL1 and the second sub driving voltage line PL1b overlaps the second data line DL2.

In an embodiment, the first sub driving voltage line PL1a or the second sub driving voltage line PL1b are shared with other pixel circuits that are nearby in the first direction. For example, based on the drawing, the first sub driving voltage line PL1a can be the first sub driving voltage line PL1a of another pixel circuit positioned on the left side of the pixel circuit shown in FIG. 3. Alternatively, based on the drawing, the second sub driving voltage line PL1b can be the second sub driving voltage line PL1b of another pixel circuit positioned on the right side of the pixel circuit shown in FIG. 3. In this case, the common voltage line VSL is not positioned between neighboring pixel circuits.

In an embodiment, the second driving voltage line PL2 extends in the first direction and is positioned between the first sub driving voltage line PL1a and the second sub driving voltage line PL1b. The second driving voltage line PL2 connects the first sub driving voltage line PL1a and the second sub driving voltage line PL1b to each other. In an embodiment, the second driving voltage line PL2 is integrally formed with the first sub driving voltage line PL1a and the second sub driving voltage line PL1b.

In an embodiment, the driving voltage line PL is electrically connected to the upper electrode CE2 of the capacitor Cst through a contact hole 77 formed in the first interlayer insulating layer 114. Therefore, the electrode voltage line HL includes the same voltage level, which is a constant voltage, as the driving voltage line PL. In addition, the driving voltage line PL is electrically connected to the source region S5 of the fifth thin-film transistor T5 through a contact hole 76 formed in the first gate insulating layer 112, the second gate insulating layer 113, and the first interlayer insulating layer 114.

In an embodiment, the common voltage line VSL crosses the first initialization voltage line VL1 and the second initialization voltage line VL2 and extends in the second direction. The common voltage line VSL is electrically connected to the first initialization voltage line VL1 through a contact hole 78 formed in the first gate insulating layer 112, the second gate insulating layer 113, and the first interlayer insulating layer 114 in a region that overlaps the first initialization voltage line VL1. The common voltage line VSL is electrically connected to the second initialization voltage line VL2 through a contact hole 79 formed in the first gate insulating layer 112, the second gate insulating layer 113, and the first interlayer insulating layer 114 in a region that overlaps the second initialization voltage line VL2. The common voltage line VSL receives a voltage transmitted to the common electrode 230, that is, the common voltage ELVSS, and transmits it to the first initialization voltage line VL1 and the second initialization voltage line VL2 as the initialization voltage.

In an embodiment, the node electrode 171 electrically connects the gate electrode G1 of the first thin-film transistor T1 to the source region S3 of the third thin-film transistor T3 and the drain region D4 of the fourth thin-film transistor T4 through the opening SOP formed in the upper electrode CE2 of the capacitor Cst. One end of the node electrode 171 is electrically connected to the gate electrode G1 of the first thin-film transistor T1 through a contact hole 72 formed in the second gate insulating layer 113 and the first interlayer insulating layer 114. The other end of the node electrode 171 is electrically connected to the drain region D4 of the fourth thin-film transistor T4 through a contact hole 71 formed in the first gate insulating layer 112, the second gate insulating layer 113, and the first interlayer insulating layer 114.

In an embodiment, one end of the connecting electrode 173 is electrically connected to the source region S2 of the second thin-film transistor T2 through a contact hole 73 formed in the first gate insulating layer 112, the second gate insulating layer 113, and the first interlayer insulating layer 114. The one end of the connecting electrode 173 functions as a source electrode that contacts the source region S2. The other end of the connecting electrode 173 overlaps the first data line DL1 and is electrically connected to the first data line DL1.

In an embodiment, one end of the connecting electrode 175 is electrically connected to a drain region D6 of the sixth thin-film transistor T6 through a contact hole 74 formed in the first gate insulating layer 112, the second gate insulating layer 113, and the first interlayer insulating layer 114. The other end of the connecting electrode 175 is electrically connected to a source region S7 of the seventh thin-film transistor T7 through a contact hole 75 formed in the first gate insulating layer 112, the second gate insulating layer 113, and the first interlayer insulating layer 114.

In an embodiment, a second interlayer insulating layer 115 may be positioned on the first interlayer insulating layer 114, the driving voltage line PL, the common voltage line VSL, the node electrode 171, and the connecting electrodes 173 and 175, and the first data line DL1, the second data line DL2, and a connecting electrode 185 may be positioned on the second interlayer insulating layer 115.

In an embodiment, the second interlayer insulating layer 115 includes at least one of silicon oxide ($SiO_2$), silicon nitride ($SiN_x$), silicon oxynitride (SION), aluminum oxide ($Al_2O_3$), titanium oxide ($TiO_2$), tantalum oxide ($Ta_2O_5$), hafnium oxide ($HfO_2$), or zinc oxide ($ZnO_2$), etc.

In an embodiment, the first data line DL1, the second data line DL2, and the connecting electrode 185 include a conductive material, such as one or more of molybdenum (Mo), aluminum (Al), copper (Cu), or titanium (Ti), etc., and may be formed of multiple layers or as a single layer. For example, the first data line DL1, the second data line DL2, and the connecting electrode 185 are formed of multiple layers of Ti/Al/Ti.

In an embodiment, the first data line DL1 and the second data line DL2 extend in the second direction and face each other. The first data line DL1 and the second data line DL2 are positioned with the first thin-film transistor T1 therebetween, in a plan view. The first data line DL1 overlaps the first sub driving voltage line PL1a, and the second data line DL2 overlaps the second sub driving voltage line PL1b.

In an embodiment, the first data line DL1 is electrically connected to the connecting electrode 173 through a contact hole 81 formed in the second interlayer insulating layer 115. Accordingly, the first data line DL1 is electrically connected to the source region S2 of the second thin-film transistor T2. The connecting electrode 173 is electrically connected to a protrusion DL1P of the first data line DL1.

In an embodiment, the connecting electrode 185 electrically connects to the connecting electrode 175 through a contact hole 84 formed in the second interlayer insulating layer 115.

In an embodiment, a first planarization layer 116 is positioned on the second interlayer insulating layer 115, the first data line DL1, the second data line DL2, and the connecting electrode 185, and connecting electrodes 191, 193, and 195 are' positioned on the first planarization layer 116.

In an embodiment, the connecting electrodes 191, 193, and 195 include a conductive material, such as one or more of molybdenum (Mo), aluminum (Al), copper (Cu), or titanium (Ti), etc., and may be formed of multiple layers or as a single layer.

In an embodiment, the connecting electrode 191 electrically connects to the connecting electrode 185 through a contact hole 91 formed in the first planarization layer 116.

In an embodiment, the connecting electrode 193 electrically connects to the common voltage line VSL through a contact hole 92 formed in the second interlayer insulating layer 115 and the first planarization layer 116.

In an embodiment, the connecting electrode 195 electrically connects to the common voltage line VSL through a contact hole 93 formed in the second interlayer insulating layer 115 and the first planarization layer 116.

In an embodiment, a second planarization layer 117 is positioned on the first planarization layer 116, the connecting electrodes 191, 193, and 195, and an organic light-emitting diode (OLED) is positioned on the second planarization layer 117.

In an embodiment, the first planarization layer 116 and the second planarization layer 117 have a flat top surface such that a pixel electrode 210 can be formed flat. In the first planarization layer 116 and the second planarization layer 117, a film that includes an organic material may be formed as a single layer or as multiple layers. The first planarization layer 116 and the second planarization layer 117 include a general-purpose polymer, such as one or more of benzocyclobutene (BCB), polyimide, Hexamethyldisiloxane (HMDSO), polymethylmethacrylate (PXMMA), or polystylene (PS), or a polymer derivative that includes a phenolic group, acrylic polymers, imide polymers, aryl ether polymers, amide polymers, fluorine polymers, p-xylene polymers, or vinyl alcohol polymers, or blends thereof.

In another embodiment, the first planarization layer 116 and the second planarization layer 117 include inorganic materials. The first planarization layer 116 and the second planarization layer 117 include one or more of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), etc. When the first planarization layer 116 and the second planarization layer 117 include inorganic materials, a chemical flattening polishing may be performed in some cases. In another embodiment, the first planarization layer 116 and the second planarization layer 117 include both organic and inorganic materials.

Although a structure of one pixel circuit is described in FIG. 3, in an embodiment, a plurality of pixel circuits that include a same pixel circuit CAN be arranged along the first direction and the second direction, where the first initialization voltage line VL1 and second initialization voltage line VL2 are shared by two pixel circuits that are adjacent in the second direction.

That is, in an embodiment, the first initialization voltage line VL1 of one pixel circuit can be a second initialization voltage line VL2 of another pixel circuit positioned below the pixel circuit shown in FIG. 3 in the second direction. Similarly, the second initialization voltage line VL2 of the one pixel circuit can be a first initialization voltage line VL1 of another pixel circuit positioned above of the pixel circuit shown in FIG. 3 along the second direction.

As shown in FIGS. 4 and 5, in an embodiment, an organic light-emitting device (OLED) may include a pixel electrode 210, a common electrode 230, and an intermediate layer 220 positioned between them and that includes a light-emitting layer.

In an embodiment, the pixel electrode 210 is electrically connected to the connecting electrode 191 through a via hole VIA formed in the second planarization layer 117 and is electrically connected to the sixth thin-film transistor T6 and seventh thin-film transistor T7.

In an embodiment, the pixel electrode 210 may be a (semi) transmissive electrode or a reflective electrode. In some embodiments, the pixel electrode 210 includes a reflective film formed of one or more of Ag, Mg, Al, Pt, Pd, Au, Ni, Nd, Ir, or Cr, or compounds thereof, and a transparent or translucent electrode layer formed on the reflective film may be provided. The transparent or translucent electrode layer includes at least one of indium tin oxide (ITO), indium zinc oxide (IZO), zinc oxide (ZnO), indium oxide ($In_2O_3$), indium gallium oxide (IGO), or aluminum zinc oxide (AZO). In some embodiments, the pixel electrode 210 has a stacked structure of ITO/Ag/ITO.

In an embodiment, a pixel defining layer 118 is positioned on the second planarization layer 117, and the pixel defining layer 118 includes an opening through which a portion of the pixel electrode 210 is exposed and that defines a light-emitting region of the pixel. The pixel defining layer 118 covers an edge of the pixel electrode 210. The pixel defining layer 118 includes organic insulating materials such as one or more of polyimide, polyamide, acrylic resin, benzocyclobutene, hexamethyldisiloxane (HMDSO), or phenol resin, etc.

In an embodiment, the intermediate layer 220 includes a light-emitting layer. The light-emitting layer includes organic materials that include a fluorescent or phosphorescent material that emits red, green, blue, or white light. The light-emitting layer may be a low molecular organic material or a high molecular organic material. In FIGS. 4 and 5, for convenience of illustration, only the light-emitting layer of the intermediate layer 220 is illustrated, and the organic light-emitting diode (OLED) may further include a first functional layer or a second functional layer on the upper and lower layers of the light-emitting layer. The first functional layer or the second functional layer may include a hole transport layer (HTL), a hole injection layer (HIL), an electron transport layer (ETL), or an electron injection layer (EIL), etc. The intermediate layer 220 corresponds to each of a plurality of pixel electrodes 210. However, embodiments are not limited thereto, and at least some of the layers in the intermediate layer 220 can be integrally formed over the plurality of pixel electrodes 210.

In an embodiment, the common electrode 230 may be a light-transmitting electrode or a reflective electrode. In some embodiments, the common electrode 230 is a metallic thin film that is a transparent or translucent electrode, and includes materials having a small work function, such as one or more of Li, Ca, LiF/Ca, LiF/Al, Al, Ag, or Mg, or compounds thereof. In addition, a transparent conductive oxide (TCO) film, such as one of ITO, IZO, ZnO, or $In_2O_3$, can be further positioned on the metal thin-film. The common electrode 230 is integrally formed and corresponds to the plurality of pixel electrodes 210.

In an embodiment, the common electrode 230 is positioned in an opening OP formed in the second planarization layer 117 and the pixel defining layer 118 to directly contact the connecting electrodes 193 and 195 in the contact region CNT.

In an embodiment, a thin-film encapsulation layer or a sealing substrate is positioned on the common electrode 230. The thin-film encapsulation layer includes at least one inorganic encapsulation layer made of an inorganic material and at least one organic encapsulation layer made of an organic material. In some embodiments, the thin-film encapsulation layer has a structure in which a first inorganic encapsulation layer, an organic encapsulation layer, and a second inorganic encapsulation layer are sequentially stacked. A sealing substrate is positioned that faces the substrate 100 and is joined with the substrate 100 outside the pixel unit 110 by a sealing member such as sealant or frit. In addition, a spacer that prevents mask stamping may be further included on the pixel defining layer 118.

Figure 6:
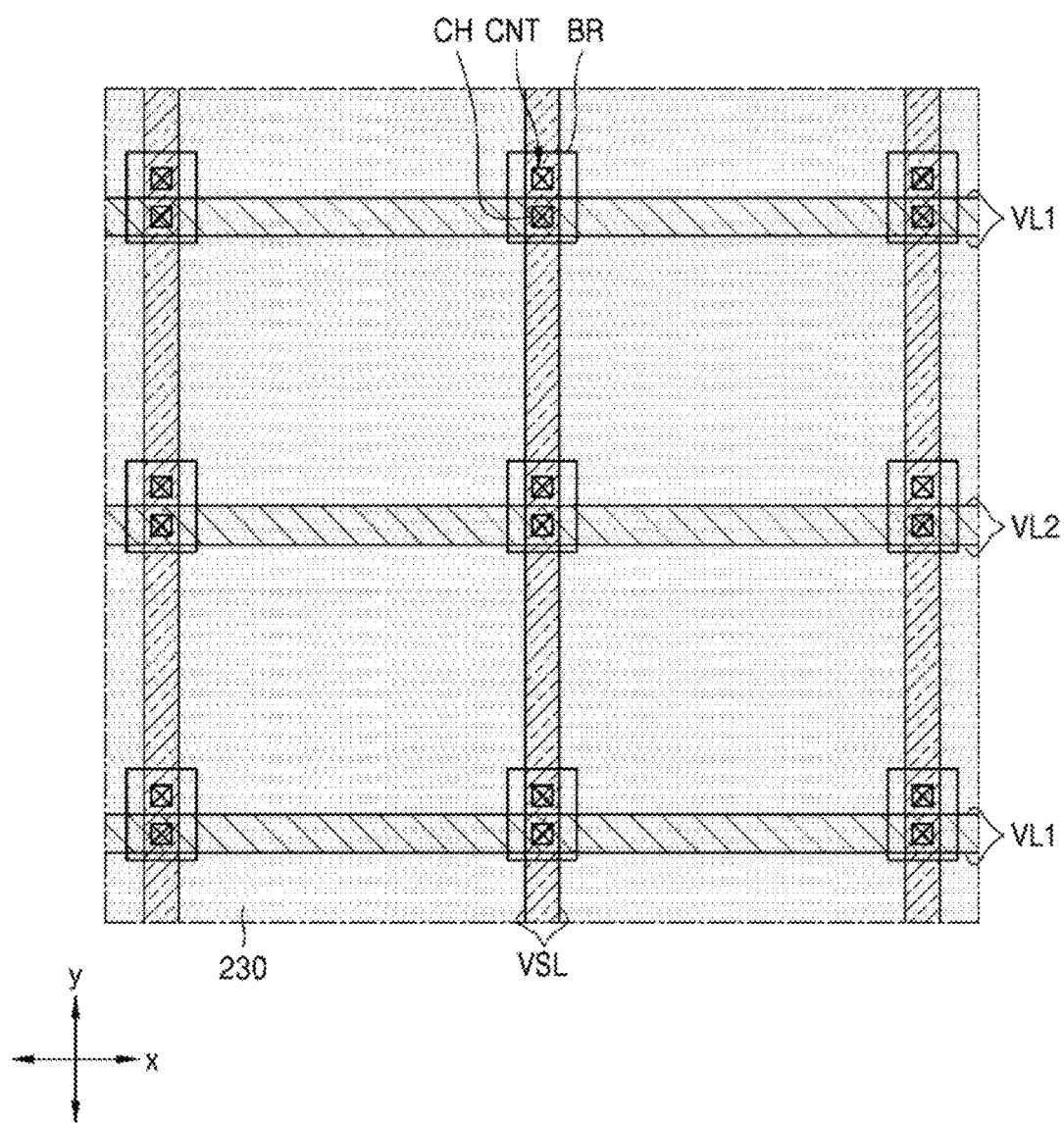
FIG. 6 schematically shows an arrangement of an initialization voltage line and a common voltage line, according to an embodiment.
Figure 7:
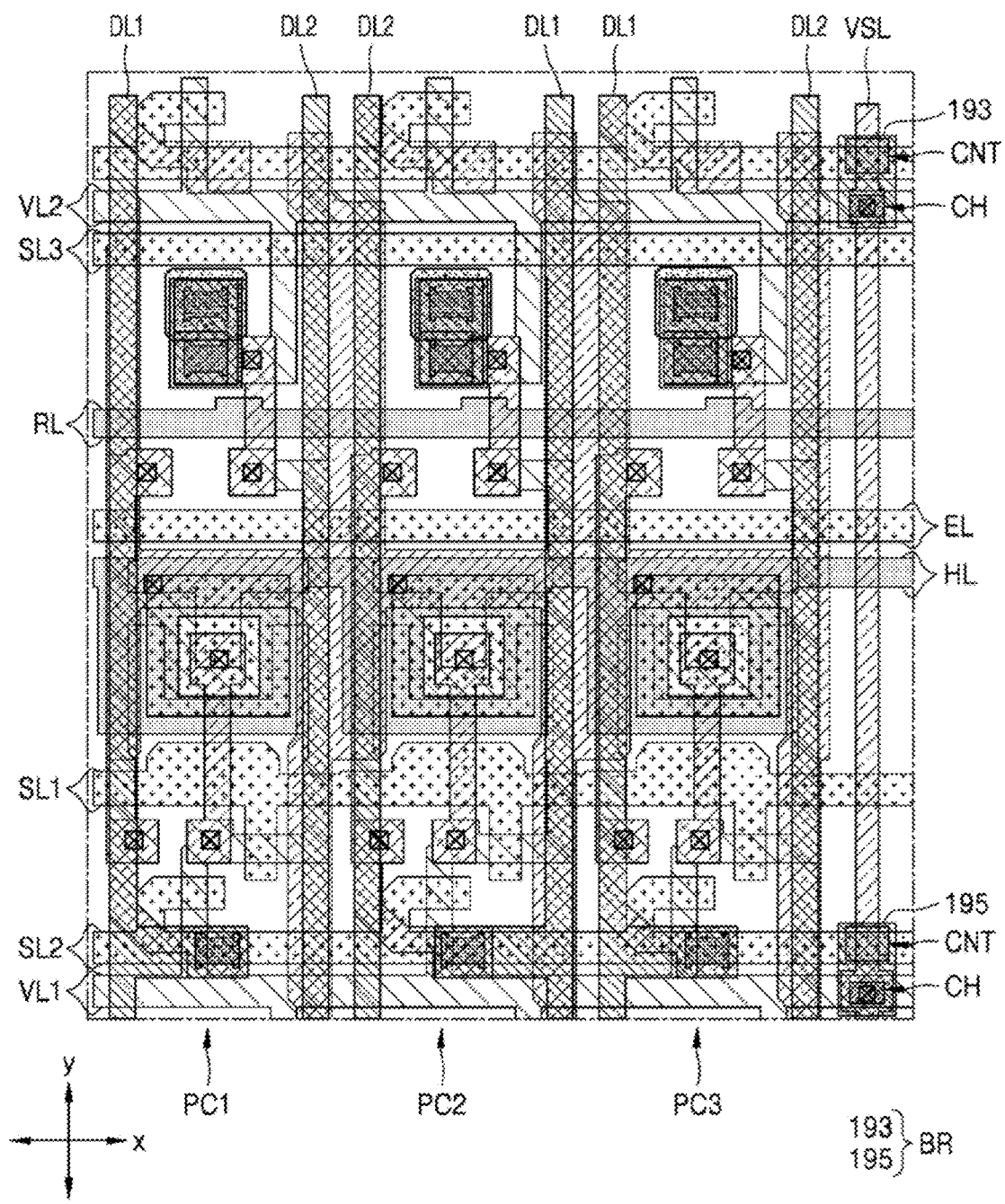
FIG. 7 is a plan view of a pixel circuit that incorporates a line arrangement of FIG. 6.

FIG. 6 shows an arrangement of an initialization voltage line and a common voltage line according to an embodiment. FIG. 7 is a plan view of a pixel circuit that incorporates a configuration of FIG. 6.

Referring to FIG. 6, in an embodiment, each of the first initialization voltage line VL1 and the second initialization voltage line VL2 on the substrate extend in the first direction. The first initialization voltage line VL1 and the second initialization voltage line VL2 are alternately arranged along the second direction. A first initialization voltage line VL1 of each pixel circuit also functions as a second initialization voltage line VL2 of a pixel circuit adjacent to the lower side along the second direction. A second initialization voltage line VL2 of each pixel circuit also functions as a first initialization voltage line VL1 of a pixel circuit adjacent to the upper side along the second direction. The first initialization voltage line VL1 and the second initialization voltage line VL2 are positioned on the same layer. The first initialization voltage line VL1 and the second initialization voltage line VL2 include a silicon semiconductor.

In an embodiment, the common voltage line VSL is positioned above the first initialization voltage line VL1 and the second initialization voltage line VL2. The common voltage line VSL extends in the seconds direction and crosses and overlaps the first initialization voltage line VL1 and the second initialization voltage line VL2. The common voltage line VSL is spaced apart along the first direction at preset intervals, for example, pixel intervals. The common voltage line VSL is positioned between pixels that are adjacent in the first direction.

In an embodiment, the common voltage line VSL is positioned on a different layer from the first initialization voltage line VL1 and the second initialization voltage line VL2. For example, the common voltage line VSL is positioned on a layer above the first initialization voltage line VL1 and the second initialization voltage line VL2. The common voltage line VSL is electrically connected to each of the first initialization voltage line VL1 and the second initialization voltage line VL2 where the common voltage line VSL crosses each of the first and second initialization voltage lines VL1 and VL2, through contact holes CH formed in the insulating layers between the common voltage line VSL and the first and second initialization voltage lines VL1 and VL2. The common voltage line VSL transmits the common voltage ELVSS to each of the first and second initialization voltage lines VL1 and VL2.

In an embodiment, a bridge electrode BR is further positioned on the common voltage line VSL. The bridge electrode BR is positioned on a layer between the common voltage line VSL and a counter electrode 230. The bridge electrode BR is in direct contact with the counter electrode 230 through an opening in the contact region CNT of the insulating layers between the bridge electrode BR and the counter electrode 230. Accordingly, the common electrode 230is electrically connected to the common voltage line VSL through the bridge electrode BR. The bridge electrode BR corresponds to the connecting electrodes 193 and 195 shown in FIGS. 4 and 5.

In an embodiment, the bridge electrode BR and the contact region CNT may be arranged at regular intervals in the first direction and the second direction. For example, the bridge electrode BR and the contact region CNT are provided at pixel intervals along the first and second directions.

In an embodiment, connection electrode 193 that overlaps the second initialization voltage line VL2 and connection electrode 195 that overlaps the first initialization voltage line VL1 each contact the common voltage line VSL through contact holes formed in lower insulating layers.

FIG. 7 corresponds to first to third pixel circuits PC1 to PC3 of first to third sub-pixels of a pixel that incorporates a pixel circuit shown in FIG. 3.

In an embodiment, the common voltage line VSL is positioned at pixel intervals. The common voltage line VSL is electrically connected to each of the shared first initialization voltage line VL1 and the shared second initialization voltage line VL2 through contact holes CH. Here, the contact holes CH are the contact holes 78 and 79 shown in FIGS. 3 to 5.

In an embodiment, the bridge electrode BR is in direct contact with the counter electrode 230 through an opening in the insulating layers between the contact region CNT and the counter electrode 230.

In an embodiment, the counter electrode 230 contacts the bridge electrode BR, such as the connecting electrodes 193 and 195, in the contact region CNT through an opening in insulating layers between the counter electrode 230 and the bridge electrode BR. Thus, the common voltage line VSL is electrically connected to the counter electrode 230. The connecting electrodes 193 and 195 are electrically connected to the common voltage line VSL through contact holes formed in lower insulating layers, such as the contact holes 92 and 94 of FIGS. 3 to 5. The connecting electrodes 193 and 195 are positioned at pixel intervals along the first direction and second direction.

Figure 8:
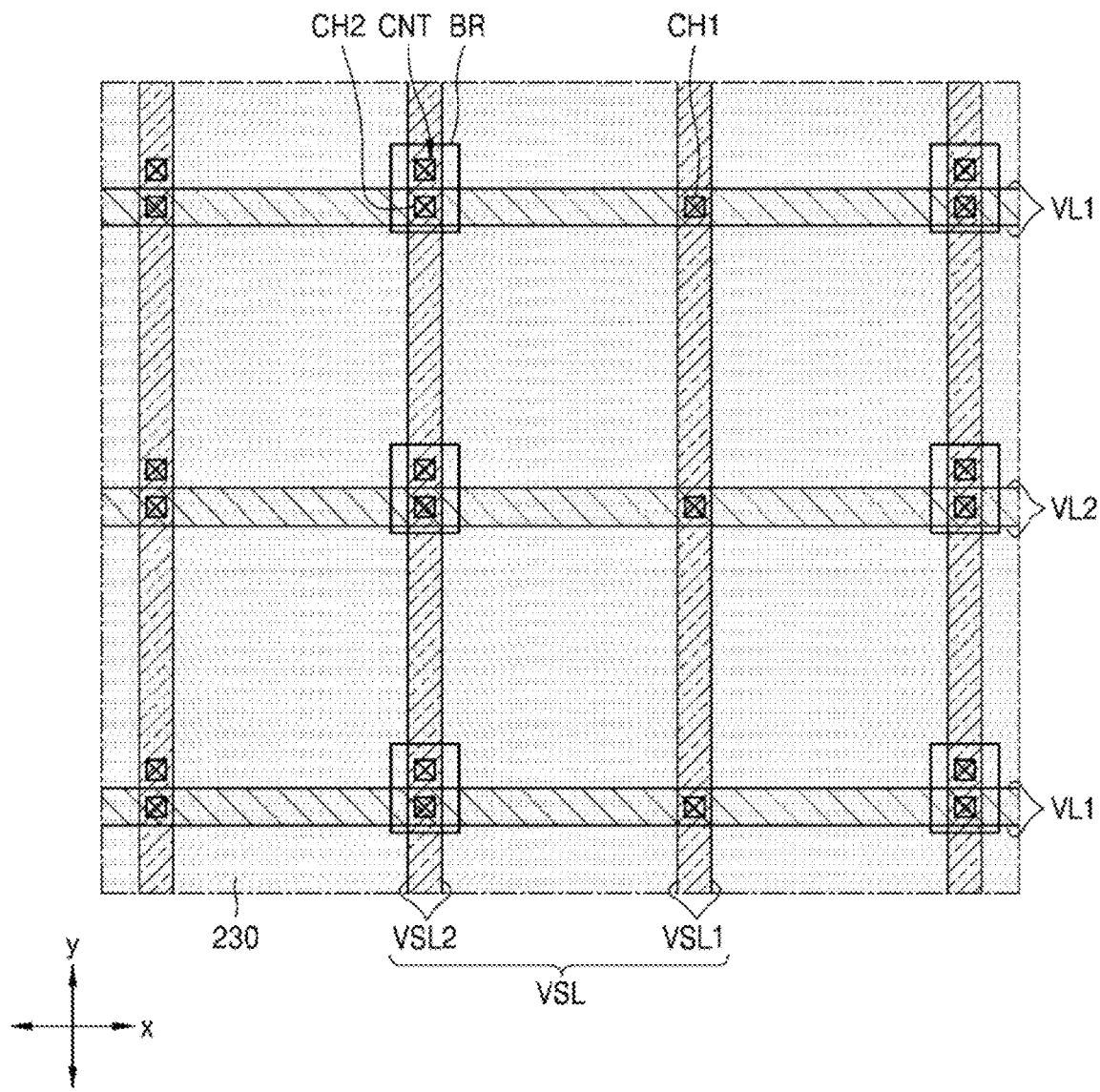
FIG. 8 schematically showing an arrangement of an initialization voltage line and a common voltage line, according to another embodiment.
Figure 9:
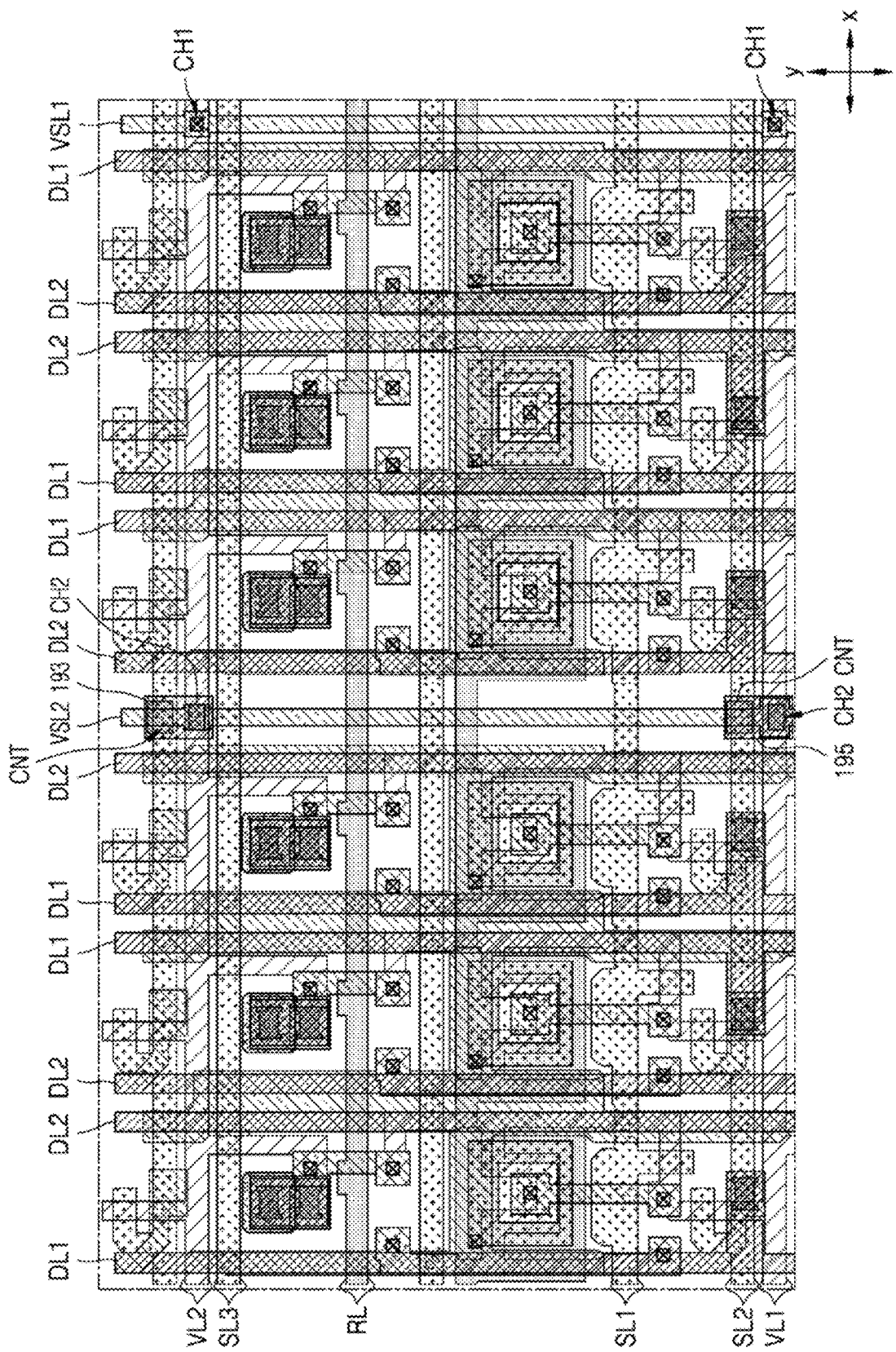
FIG. 9 is a plan view of a pixel circuit that incorporates a line arrangement of FIG. 8.

FIG. 8 schematically shows the arrangement of an initialization voltage line and a common voltage line according to an embodiment. FIG. 9 is a plan view of a pixel circuit that incorporates a configuration of FIG. 8.

Referring to FIG. 8, in an embodiment, a first initialization voltage line VL1 and a second initialization voltage line VL2 each extend in the first direction on the substrate. The first initialization voltage line VL1 and the second initialization voltage line VL2 are alternately arranged along the second direction. A first initialization voltage line VL1 of each pixel circuit also functions as a second initialization voltage line VL2 of a pixel circuit adjacent to the lower side along the second direction. A second initialization voltage line VL2 of each pixel circuit also functions as a first initialization voltage line VL1 of a pixel circuit adjacent to the upper side along the second direction. The first initialization voltage line VL1 and the second initialization voltage line VL2 are positioned on the same layer. The first initialization voltage line VL1 and the second initialization voltage line VL2 include a silicon semiconductor.

In an embodiment, the common voltage line VSL is positioned on a different layer from that of the first initialization voltage line VL1 and the second initialization voltage line VL2. For example, the common voltage line VSL is positioned above the first initialization voltage line VL1 and the second initialization voltage line VL2.

In an embodiment, the common voltage line VSL includes a first common voltage line VSL1 and a second common voltage line VSL2. The first common voltage line VSL1 and the second common voltage line VSL2 cross the first initialization voltage line VL1 and the second initialization voltage line VL2, respectively, and extend in the second direction. The first common voltage line VSL1 and the second common voltage line VSL2 may be positioned between pixels that are adjacent in the first direction, but are respectively positioned at intervals of two pixels as they are alternately positioned along the first direction.

In an embodiment, the first common voltage line VSL1 contacts and is electrically connected to each of the first initialization voltage line VL1 and the second initialization voltage line VL2 through a contact hole CH1 in the lower insulating layers where the first common voltage line VSL1 crosses the first initialization voltage line VL1 and the second initialization voltage line VL2. Here, the contact hole CH1 corresponds to the contact holes 78 and 79 shown in FIGS. 3 to 5. The first common voltage line VSL1 transmits the common voltage ELVSS to each of the first initialization voltage line VL1 and the second initialization voltage line VL2 as an initialization voltage. A bridge electrode BR is not provided on the first common voltage line VSL1.

In an embodiment, a bridge electrode BR that overlaps the second common voltage line VSL2 is provided on the second common voltage line VSL2. The bridge electrode BR is electrically connected to the second common voltage line VSL2 through a contact hole CH2 in the lower insulating layers. For example, the bridge electrode BR corresponds to the connecting electrodes 193 and 195 shown in FIGS. 3 to 5, and the contact hole CH2 corresponds to the contact holes 92 and 94 shown in FIGS. 3 to 5. The bridge electrode BR contacts the counter electrode 230 at the contact region CNT in an opening in the upper insulating layers. That is, the second common voltage line VSL2 contacts the counter electrode 230 at two pixel intervals along the first direction. The second common voltage line VSL2 transmits the common voltage ELVSS to the counter electrode 230.

In an embodiment, the second common voltage line VSL2 is electrically connected to each of the first initialization voltage line VL1 and the second initialization voltage line VL2 where the second common voltage line VSL2 crosses the first initialization voltage line VL1 and the second initialization voltage line VL2, through the contact hole in the lower insulating layers.

In another embodiment, the second common voltage line VSL2 crosses each of the first initialization voltage line VL1 and the second initialization voltage line VL2, but does not contact the first initialization voltage line VL1 and the second initialization voltage line VL2. In this case, voltages transmitted to the first common voltage line VSL1 and the second common voltage line VSL2 differ from each other. For example, the first common voltage line VSL1 transmits a voltage different from the common voltage ELVSS to the first initialization voltage line VL1 and the second initialization voltage line VL2 as initialization voltage, and the second common voltage line VSL2 transmits the common voltage ELVSS to a common electrode.

FIG. 9 illustrates first to third pixel circuits PC1 to PC3 of first to third sub-pixels in a pixel that incorporates a pixel circuit shown in FIG. 3.

In an embodiment, a first common voltage line VSL1 and a second common voltage line VSL2 are alternately positioned between every two pixels that are adjacent in the first direction.

In an embodiment, the first common voltage line VSL1 is electrically connected to each of the first initialization voltage line VL1 and the second initialization voltage line VL2 shared through a contact hole CH1 by pixels that are adjacent in the first direction. Here, the contact holes CH1 correspond to the contact holes 78 and 79 shown in FIGS. 3 to 5.

In an embodiment, connecting electrodes 193 and 195 that correspond to the bridge electrode BR of FIG. 8 are positioned on the second common voltage line VSL2, and the connecting electrodes 193 and 195 are electrically connected to the second common voltage line VSL2 through a contact hole CH2, such as the contact holes 92 and 94 of FIGS. 3 to 5. The connecting electrodes 193 and 195 contact a counter electrode in the contact region CNT and are electrically connected to the counter electrode.

In an embodiment shown in FIG. 9, the second common voltage line VSL2 crosses each of the first initialization voltage line VL1 and the second initialization voltage line VL2, but does not contact the first initialization voltage line VL1 and the second initialization voltage line VL2. However, in another embodiment, the second common voltage line VSL2 contacts and is electrically connected to each of the first initialization voltage line VL1 and the second initialization voltage line VL2.

Figure 10:
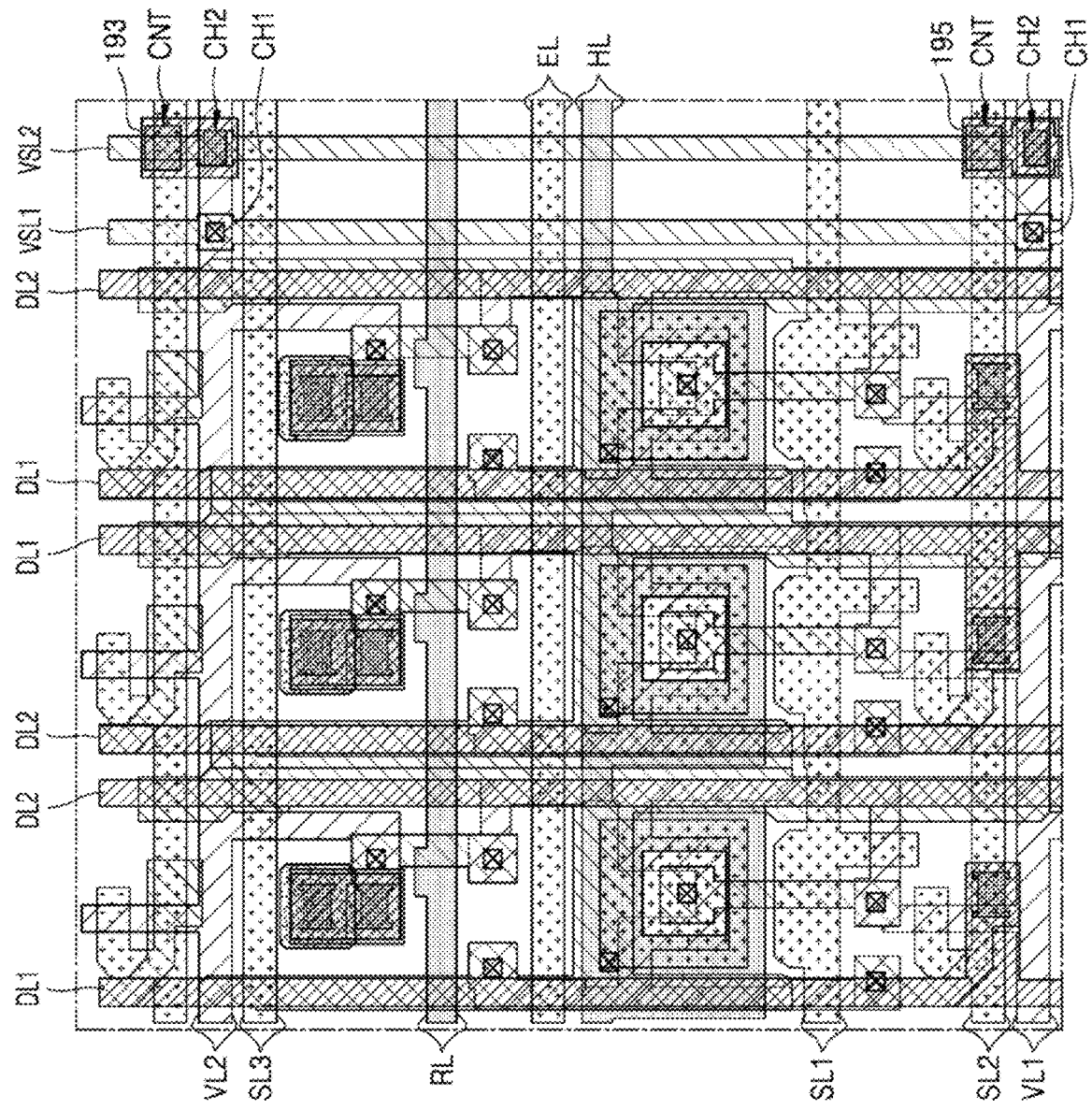
FIG. 10 is a plan view of a pixel circuit according to an embodiment.

FIG. 10 is a plan view of a pixel circuit according to an embodiment.

FIG. 10 illustrates the first to third pixel circuits PC1 to PC3 of first to third sub-pixels in a pixel that incorporates a pixel circuit shown in FIG. 3.

Referring to FIG. 10, in an embodiment, a first common voltage line VSL1 and a second common voltage line VSL2 are provided at each pixel interval between adjacent pixels in the first direction. A pair of adjacent first and second common voltage lines VSL1 VSL2 that extend in parallel in the second direction is disposed between adjacent pixels.

In an embodiment, the first common voltage line VSL1 is electrically connected to each of the first initialization voltage line VL1 and the second initialization voltage line VL2 through a contact hole CH1. Here, the contact holes CH1 corresponds to the contact holes 78 and 79 shown in FIGS. 3 to 5.

In an embodiment, connecting electrodes 193 and 195 that correspond to the bridge electrode BR of FIG. 8 are positioned on the second common voltage line VSL2, and the connecting electrodes 193 and 195 are electrically connected to the second common voltage line VSL2 through the contact hole CH2, such as the contact holes 92 and 94 of FIGS. 3 to 5. The connecting electrodes 193 and 195 contact and are electrically to a counter electrode in the contact region CNT.

In an embodiment shown in FIG. 10, the second common voltage line VSL2 crosses each of the first initialization voltage line VL1 and the second initialization voltage line VL2, but does not contact the first initialization voltage line VL1 and the second initialization voltage line VL2. However, in another embodiment, the second common voltage line VSL2 contacts and is electrically connected to each of the first initialization voltage line VL1 and the second initialization voltage line VL2. In this case, voltages transmitted to the first common voltage line VSL1 and the second common voltage line VSL2 can differ from each other. For example, the first common voltage line VSL1 transmits a voltage different from the common voltage ELVSS to the first initialization voltage line VL1 and the second initialization voltage line VL2 as initialization voltage, and the second common voltage line VSL2 transmits the common voltage ELVSS to a common electrode.

The above-described embodiments show an example in which identical data lines, such as a pair of first data lines or a pair of second data lines, are positioned between adjacent pixel circuits. Embodiments are not limited thereto, and in other embodiments, even in a display device that incorporates a pixel circuit that has a pair of first and second data lines positioned between adjacent pixel circuits, a common voltage line VSL may be positioned at preset intervals and electrically connected to an initialization voltage line so that the common voltage ELVSS is thereby provided to a pixel as an initialization voltage.

The above-described embodiments show an example of a pixel circuit in which two data lines are positioned for each column. Embodiments are not limited thereto, and other embodiments, even in a display device that incorporates a pixel circuit in which one data line is positioned for each column, the common voltage line VSL may be positioned at preset intervals and electrically connected to an initialization voltage line so that the common voltage ELVSS is thereby provided to a pixel as an initialization voltage.

Figure 11:
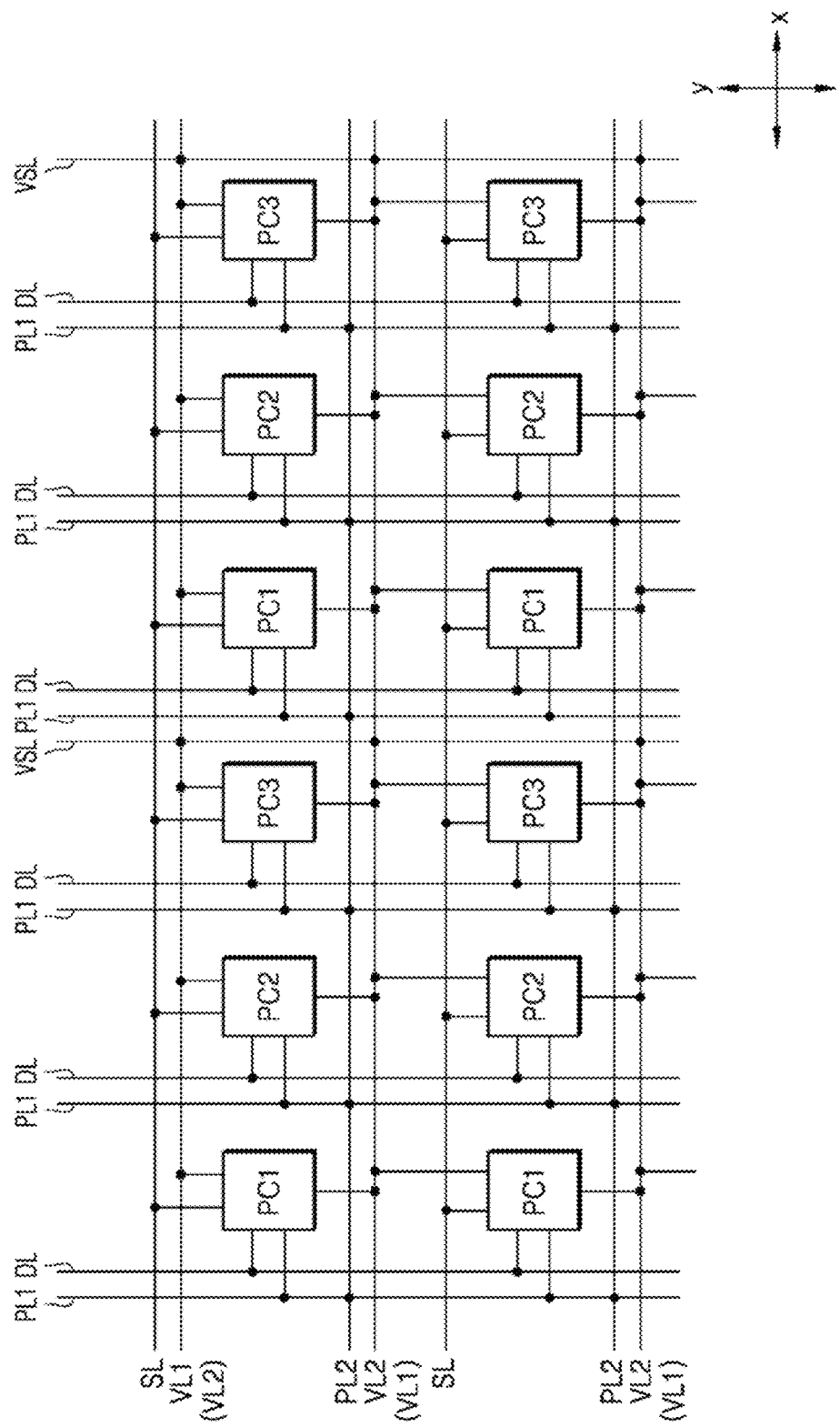
FIG. 11 schematically shows an arrangement of a pixel circuit and a common voltage line according to an embodiment.

FIG. 11 schematically shows an arrangement of a pixel circuit and a common voltage line according to an embodiment.

Referring to FIG. 11, in an embodiment, the first, second and third pixel circuits PC1, PC2, and PC3 of the first to third sub-pixels in a pixel on a substrate are repeatedly arranged in the first direction and the second direction.

In an embodiment each of the first, second and third pixel circuits PC1, PC2, and PC3 are connected to a scan line SL, a first initialization voltage line VL1, and a second initialization voltage line VL2, each extending in the first direction, and is connected to a data line DL that extends in the second direction. As shown in FIG. 2, the scan line SL includes first, second and third scan lines SL1, SL2, and SL3.

In an embodiment, a first initialization voltage line VL1 of each pixel circuit also functions as a second initialization voltage line VL2 of a pixel circuit adjacent to the lower side along the second direction. A second initialization voltage line VL2 of each pixel circuit also functions as a first initialization voltage line VL1 of a pixel circuit adjacent to the upper side along the second direction.

In an embodiment, each of the first, second and third pixel circuits PC1, PC2, and PC3 is connected to a driving voltage line. The driving voltage line includes a first driving voltage line PL1 that extends in the second direction, and a second driving voltage line PL2 that extends in the first direction. The first driving voltage line PL1 and the second driving voltage line PL2 are connected to each other. In an embodiment, each of the first driving voltage line PL1 and the second driving voltage line PL2 is positioned on a different layer and they are electrically connected to each other. In another embodiment, the first driving voltage line PL1 and the second driving voltage line PL2 are positioned in the same layer, and are integrally formed. The driving voltage line has a mesh structure formed by the first driving voltage line PL1 and the second driving voltage line PL2.

In an embodiment, the common voltage line VSL extends in the second direction and is spaced apart at regular intervals along the first direction. For example, the common voltage line VSL is positioned at pixel intervals. The common voltage line VSL is connected to each of the first initialization voltage line VL1 and the second initialization voltage line VL2. Accordingly, the first initialization voltage line VL1 and the second initialization voltage line VL2 receive the common voltage ELVSS from the common voltage line VSL. The common voltage line VSL is connected to a common electrode of an organic light-emitting diode.

In another embodiment, the first common voltage line VSL1 and the second common voltage line VSL2 of the common voltage line VSL are alternately positioned at pixel intervals and contact the common electrode at every other pixel interval, as shown in FIG. 8. In another embodiment, the first common voltage line VSL1 and the second common voltage line VSL2 of the common voltage line VSL are positioned together at pixel intervals, as shown in FIG. 10.

Figure 12:
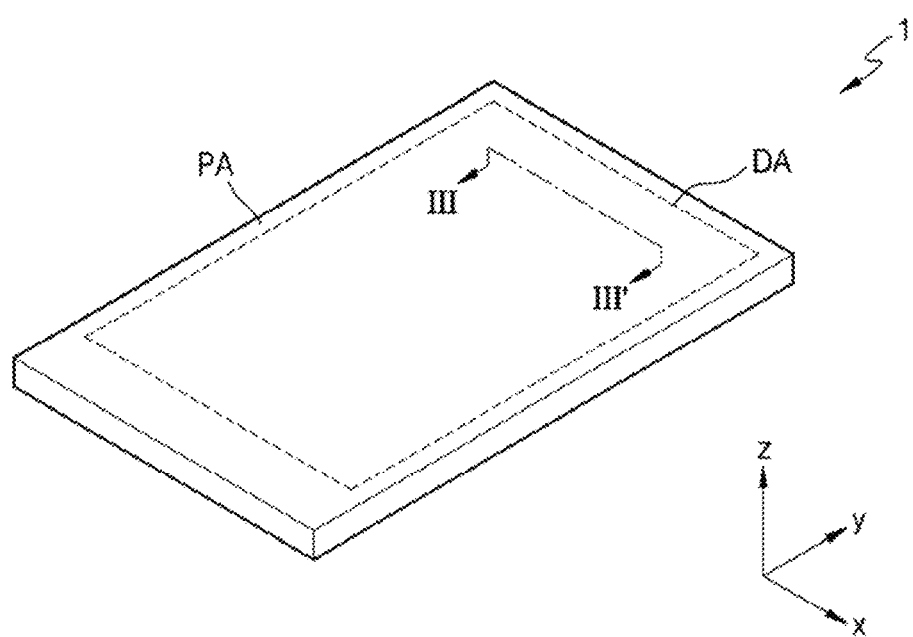
FIG. 12 is a perspective view of a display device according to an embodiment.

FIG. 12 is a perspective view of a display device according to an embodiment.

A display device according to embodiments of the disclosure may be implemented as an electronic device, such as a smart phone, a mobile phone, a smart watch, a navigation device, a game machine, a TV, a vehicle head unit, a laptop computer, a laptop computer, a tablet computer, a personal media player (PMP), or a personal digital assistant (PDA), etc. In addition, the electronic device may be a flexible device.

In an embodiment, a display device 1 includes a display region DA in which an image is displayed, and a peripheral region PA around the display region DA. The display device 1 displays an image using light emitted from a plurality of pixels positioned in the display region DA.

In an embodiment, the display device 1 may have one of various shapes, such as a rectangular shape that includes two pairs of parallel sides. When the display device has a rectangular shape, one of the two pairs of sides is longer than the other pair of sides. In an embodiment, for convenience of description, a display device has a rectangular shape that includes a pair of long sides and a pair of short sides, where the short sides extend in the first direction (x direction), the long sides extend in the second direction (y direction), and the direction perpendicular to a plane defined by the long side and the short side is a third direction (z direction). In another embodiment, the display device 1 may have a non-rectangular shape. The non-rectangular shape may be, for example, a circle, an ellipse, a partially circular polygon, or a polygon other than a rectangle.

In an embodiment, when viewing the display region DA in a plan view, the display region DA may have a rectangular shape as shown in FIG. 1. In another embodiment, the display region DA may have a polygonal shape, such as a triangle, a pentagon, or a hexagon, but may also have a circular shape, an ellipse shape, or an irregular shape. The display region DA corresponds to the pixel unit 110 shown in FIG. 1.

In an embodiment, the peripheral region PA is positioned around the display region DA, and is a non-display region in which no pixels are positioned. The display region DA may be entirely enclosed by the peripheral region PA, i.e., the peripheral region may surround the display region. The peripheral region PA includes various wires that transmit electric signals to the display region DA, printed circuit board substrates, or pads to which a driver IC chip is attached. For example, the controller 120, scan driver 130, light emission control driver 140, data driver 150 and power supply 160 shown in FIG. 1 are positioned in the peripheral region PA.

Figure 13:
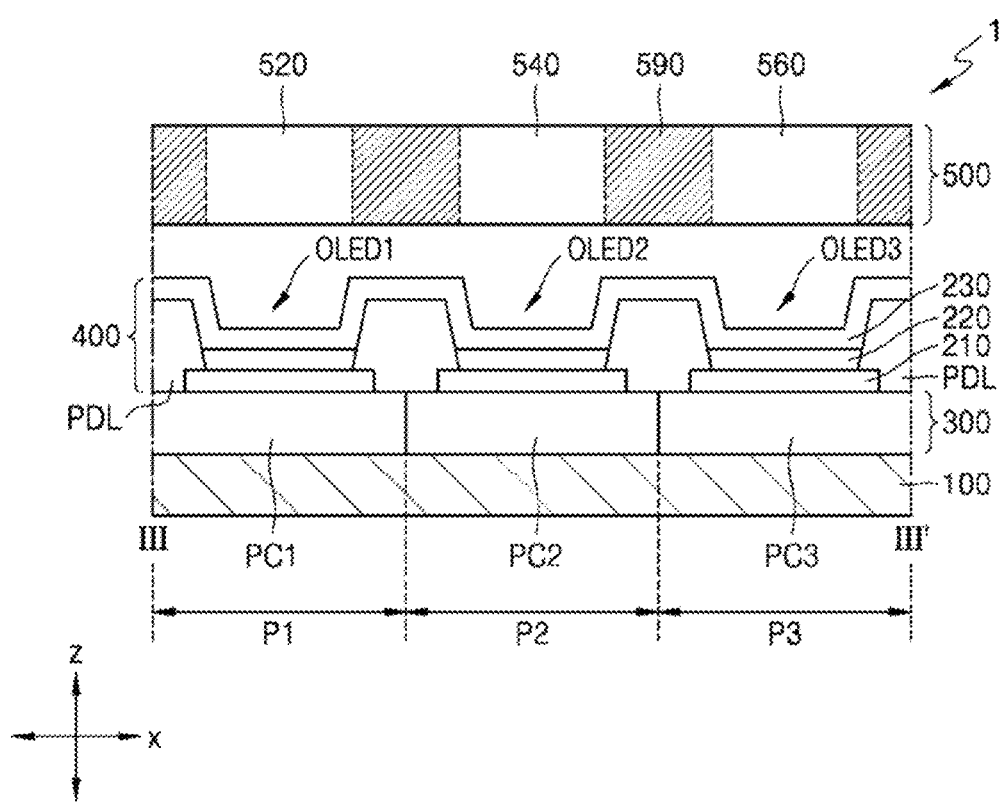
FIG. 13 is a cross-sectional view of a configuration of a display device according to an embodiment.

FIG. 13 is a cross-sectional view of a configuration of a display device according to an embodiment. FIG. 13 is a cross-sectional view of the display device taken along III-III' of FIG. 12.

Referring to FIG. 13, in an embodiment, the display device 1 include a substrate 100, a pixel circuit layer 300 that includes pixel circuits on the substrate 100, and a display layer 400 that includes display elements on the pixel circuit layer 300.

In an embodiment, the display element is an organic light-emitting diode (OLED) that includes a stacked structure of a pixel electrode 210, an intermediate layer 220, and a common electrode 230. The common electrode 230 is provided in common for all pixels and faces the plurality of pixel electrodes 210. The pixel circuit includes a thin-film transistor and a capacitor, and is the pixel circuit PC shown an embodiment of FIG. 2.

In an embodiment, first to third sub-pixels P1 to P3 are disposed in the display region of the substrate 100. A first sub-pixel P1 includes a first organic light-emitting diode OLED1 and a first pixel circuit PC1 that controls the first organic light-emitting diode OLED1. A second sub-pixel P2 includes a second organic light-emitting diode OLED2 and a second pixel circuit PC2 that controls the second organic light-emitting diode OLED2. A third sub-pixel P3 includes a third organic light-emitting diode OLED3 and a third pixel circuit PC3 that controls the third organic light-emitting diode OLED3.

In an embodiment, the first to third pixel circuits PC1 to PC3 are positioned on the pixel circuit layer 300, and the first to third organic light-emitting diodes OLED1 to OLED3 are positioned on the display layer 400. A pixel defining layer PDL is positioned between the first to third organic light-emitting diodes OLED1 to OLED3. The first to third organic light-emitting diodes OLED1 to OLED3 may at least partially overlap the corresponding first to third pixel circuits PC1 to PC3, respectively.

In an embodiment, the display device 1 further includes a color filter 500. The color filter 500 includes a first, second, and third filter 520, 540, and 560 positioned to correspond to light-emitting regions of the first to third organic light-emitting diodes OLED1 to OLED3, respectively. In an embodiment, the first, second, and third filters 520, 540, and 560 are red, green, and blue filters, respectively. A black matrix 590 is positioned as a light blocking member between adjacent first, second, and third filters 520, 540, and 560.

In an embodiment, each of the first to third organic light-emitting diodes OLED1 to OLED3 includes a light-emitting layer in the intermediate layer 220 so as to emit red, green, and blue light, respectively.

In another embodiment, the first to third organic light-emitting diodes OLED1 to OLED3 all emit blue light. In this case, the third filter 560 of the color filter 500 is a transmissive or transparent layer. The first and second filters 520 and 540 include a photosensitive polymer in which quantum dots and scattering particles are dispersed. The transmissive layer includes a photosensitive polymer in which scattering particles are dispersed.

A display device according to embodiments of the disclosure includes a common voltage line that contacts a common electrode as an auxiliary electrode of the common electrode in the display region. The common voltage line extends in the second direction and is connected to the first initialization voltage line VL1 and the second initialization voltage line VL2 that extend in the first direction and form a mesh structure. Therefore, a common voltage ELVSS can be transmitted to the pixels of the display device in the horizontal and vertical directions. Accordingly, the wire region that supplies the common voltage ELVSS can be further expanded so that a voltage drop due to resistance of the common electrode can be minimized.

A display device according to an embodiment as described above, in which the voltage drop of a common electrode is avoided, may provide a high quality image.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device, comprising:
   a plurality of pixels, wherein each of the plurality of pixels includes at least two sub-pixels, and each of the at least two sub-pixels includes a pixel electrode;
   a first initialization voltage line and a second initialization voltage line, wherein each of the first initialization voltage line and the second initialization voltage line extends in a first direction and are connected to pixels that are adjacent in the first direction;
   a plurality of first common voltage lines positioned between adjacent pixels in the first direction, extend in a second direction different from the first direction, and are connected to the first initialization voltage line and the second initialization voltage line;
   a common electrode that faces the pixel electrodes of the plurality of pixels,
   a plurality of second common voltage lines positioned between adjacent pixels in the first direction, extend in the second direction, and are connected to the first initialization voltage line and the second initialization voltage line; and
   a plurality of connecting electrodes disposed on a layer between the second common voltage lines and the pixel electrodes, wherein each of the plurality of connecting electrodes contacts the common electrode and one of the second common voltage lines,
wherein the plurality of first common voltage lines and the plurality of second common voltage lines are alternately positioned along the first direction.

2. The display device of claim 1, wherein each of the first initialization voltage line and the second initialization voltage line includes a semiconductor material.

3. The display device of claim 2, further comprising a plurality of connecting electrodes disposed on a layer between the first common voltage lines and the pixel electrodes and that contact the plurality of first common voltage lines and the common electrode.

4. The display device of claim 3, wherein the plurality of connecting electrodes include
a first connecting electrode disposed in a region in which the first initialization voltage line and the first common voltage line overlap each other, and
a second connecting electrode disposed in a region in which the second initialization voltage line and the first common voltage line overlap each other.

5. The display device of claim 1, wherein a same voltage is transmitted to the common electrode, the plurality of first common voltage lines and the second common voltage lines.

6. The display device of claim 1, further comprising a plurality of data lines respectively connected to the sub-pixels and that extend in the second direction.

7. A display device, comprising:
a plurality of pixels, wherein each of the plurality of pixels includes at least two sub-pixels, and each of the at least two sub-pixels includes a pixel electrode;
a first initialization voltage line;
a second initialization voltage line, wherein each of the first initialization voltage line and the second initialization voltage line extends in a first direction and is connected to adjacent pixels;
a plurality of first common voltage lines, that extend in a second direction different from the first direction, and that are connected to the first initialization voltage line and the second initialization voltage line;
a plurality of second common voltage lines that extend in the second direction, and connected to the first initialization voltage line and the second initialization voltage line;
a common electrode that faces the plurality of pixel electrodes; and
a plurality of connecting electrodes disposed on a layer between the second common voltage lines and the pixel electrodes, and that connect the common electrode and one of the plurality of second common voltage lines,
wherein a pair of a first common voltage line and a second common voltage line are positioned adjacent to each other between adjacent pixels.

8. The display device of claim 7, wherein a same voltage is transmitted to the common electrode and the plurality of first common voltage lines.

9. The display device of claim 7, further comprising:
a driving thin-film transistor that is connected to first initialization voltage line; and
a driving voltage line connected to the driving thin-film transistor, wherein the driving voltage line comprises:
a first driving voltage line that extends in a first direction; and
a second driving voltage line that extends in a second direction different from the first direction and is connected to the first driving voltage line.

* * * * *